(12) United States Patent
Jeong et al.

(10) Patent No.: US 11,133,296 B2
(45) Date of Patent: *Sep. 28, 2021

(54) SEMICONDUCTOR PACKAGE

(71) Applicant: SAMSUNG ELECTRONICS CO., LTD., Suwon-si (KR)

(72) Inventors: Chanhee Jeong, Chungcheongnam-do (KR); Hyunki Kim, Chungcheongnam-do (KR); Junwoo Park, Suwon-si (KR); Byoung Wook Jang, Chungcheongnam-do (KR); Sunchul Kim, Chungcheongnam-do (KR); Su-Min Park, Suwon-si (KR); Pyoungwan Kim, Suwon-si (KR); Inku Kang, Hwaseong-si (KR); Heeyeol Kim, Chungcheongnam-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/698,749

(22) Filed: Nov. 27, 2019

(65) Prior Publication Data
US 2020/0098734 A1    Mar. 26, 2020

Related U.S. Application Data

(63) Continuation of application No. 15/818,346, filed on Nov. 20, 2017, now Pat. No. 10,622,340.

(30) Foreign Application Priority Data

Nov. 21, 2016 (KR) .................. 10-2016-0155195
Apr. 20, 2017 (KR) .................. 10-2017-0051203

(51) Int. Cl.
*H01L 25/10* (2006.01)
*H01L 23/31* (2006.01)
(Continued)

(52) U.S. Cl.
CPC ........ *H01L 25/105* (2013.01); *H01L 21/4853* (2013.01); *H01L 21/4857* (2013.01);
(Continued)

(58) Field of Classification Search
None
See application file for complete search history.

(56) References Cited

U.S. PATENT DOCUMENTS 6,329,610 B1    12/2001  Takubo
6,611,063 B1 *   8/2003  Ichinose ............ H01L 21/4832
                                                         257/222

(Continued)

OTHER PUBLICATIONS

Li et al., "An Improvement of Thermal Conductivity of Underfill Materials for Flip-Chip Packages", IEEE Transactions on Advanced Packaging, vol. 26, No. 1, Feb. 2003, pp. 25-32. *Year: 2003).

*Primary Examiner* — Vincent Wall
(74) *Attorney, Agent, or Firm* — Volentine, Whitt & Francos, PLLC

(57) ABSTRACT

A semiconductor package includes a semiconductor chip disposed on a first substrate, a mold layer covering a sidewall of the semiconductor chip and including a through-hole, a second substrate disposed on the semiconductor chip, a connection terminal disposed between the first substrate and the second substrate and provided in the through-hole, and an underfill resin layer extending from between the semiconductor chip and the second substrate into the through-hole.

18 Claims, 19 Drawing Sheets

(51) Int. Cl.
*H01L 21/48* (2006.01)
*H01L 21/56* (2006.01)
*H01L 23/538* (2006.01)
*H01L 23/00* (2006.01)
*H01L 25/00* (2006.01)
*H01L 23/498* (2006.01)

(52) U.S. Cl.
CPC ........ *H01L 21/565* (2013.01); *H01L 23/3121* (2013.01); *H01L 23/3128* (2013.01); *H01L 23/3135* (2013.01); *H01L 23/5383* (2013.01); *H01L 23/5385* (2013.01); *H01L 24/19* (2013.01); *H01L 24/20* (2013.01); *H01L 24/97* (2013.01); *H01L 25/50* (2013.01); *H01L 23/49811* (2013.01); *H01L 23/49816* (2013.01); *H01L 23/5386* (2013.01); *H01L 23/5389* (2013.01); *H01L 24/13* (2013.01); *H01L 24/32* (2013.01); *H01L 24/48* (2013.01); *H01L 2224/04042* (2013.01); *H01L 2224/13101* (2013.01); *H01L 2224/16225* (2013.01); *H01L 2224/214* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/97* (2013.01); *H01L 2225/0651* (2013.01); *H01L 2225/06568* (2013.01); *H01L 2225/1023* (2013.01); *H01L 2225/1035* (2013.01); *H01L 2225/1041* (2013.01); *H01L 2225/1058* (2013.01); *H01L 2924/00014* (2013.01); *H01L 2924/15151* (2013.01); *H01L 2924/15311* (2013.01)

(56) References Cited

U.S. PATENT DOCUMENTS

| | | | | |
|---|---|---|---|---|
| 7,608,921 | B2 | 10/2009 | Pendse | |
| 7,642,656 | B2 * | 1/2010 | Yoo | H01L 23/5385 257/777 |
| 8,159,061 | B2 | 4/2012 | Kawabata | |
| 8,299,595 | B2 * | 10/2012 | Yoon | H01L 24/73 257/686 |
| 8,531,043 | B2 * | 9/2013 | Ha | H01L 25/16 257/787 |
| 8,736,033 | B1 | 5/2014 | Chuo | |
| 8,829,686 | B2 * | 9/2014 | Hong | H01L 23/498 257/777 |
| 9,029,998 | B2 * | 5/2015 | Jang | H01L 23/5389 257/686 |
| 9,269,648 | B2 | 2/2016 | Higgins | |
| 9,305,855 | B2 * | 4/2016 | Kim | H01L 25/10 |
| 9,502,342 | B2 | 11/2016 | Kim | |
| 9,741,630 | B2 | 8/2017 | Ko | |
| 10,475,749 | B2 * | 11/2019 | Kim | H01L 23/544 |
| 10,622,340 | B2 * | 4/2020 | Jeong | H01L 23/3128 |
| 10,756,075 | B2 * | 8/2020 | Hong | H01L 24/49 |
| 2003/0134450 | A1 * | 7/2003 | Lee | H01L 23/13 438/106 |
| 2006/0055017 | A1 * | 3/2006 | Cho | H01L 25/105 257/686 |
| 2008/0169546 | A1 | 7/2008 | Kwon | |
| 2009/0174081 | A1 * | 7/2009 | Furuta | H01L 23/5385 257/777 |
| 2010/0072598 | A1 | 3/2010 | Oh | |
| 2010/0072634 | A1 * | 3/2010 | Ha | H01L 25/105 257/787 |
| 2010/0330742 | A1 | 12/2010 | Sugiyama | |
| 2012/0049348 | A1 | 3/2012 | Ro | |
| 2013/0187288 | A1 | 7/2013 | Hong | |
| 2014/0035137 | A1 | 2/2014 | Kwon | |
| 2014/0048906 | A1 * | 2/2014 | Shim | H01L 21/561 257/531 |
| 2014/0070396 | A1 | 3/2014 | Kyozuka | |
| 2014/0124910 | A1 | 5/2014 | Lee | |
| 2014/0210109 | A1 | 7/2014 | Tanaka | |
| 2014/0252646 | A1 | 9/2014 | Hung | |
| 2014/0264839 | A1 | 9/2014 | Tsai | |
| 2014/0291830 | A1 | 10/2014 | Hwang | |
| 2014/0327129 | A1 | 11/2014 | Cho | |
| 2014/0339708 | A1 | 11/2014 | Jang | |
| 2015/0115466 | A1 * | 4/2015 | Kim | H01L 23/28 257/774 |
| 2015/0115467 | A1 | 4/2015 | Park et al. | |
| 2015/0130041 | A1 * | 5/2015 | Seo | H01L 25/16 257/686 |
| 2016/0027764 | A1 * | 1/2016 | Kim | H01L 24/97 257/686 |
| 2016/0056103 | A1 | 2/2016 | Kim | |
| 2016/0307778 | A1 | 10/2016 | Lin et al. | |
| 2016/0315071 | A1 * | 10/2016 | Zhai | H01L 24/24 |
| 2017/0178992 | A1 | 6/2017 | Jeong | |
| 2017/0358535 | A1 | 12/2017 | Yoo | |
| 2018/0145061 | A1 | 5/2018 | Jeong | |
| 2018/0226356 | A1 * | 8/2018 | Ikeda | H01L 23/31 |
| 2020/0006089 | A1 * | 1/2020 | Yu | H01L 24/17 |

* cited by examiner

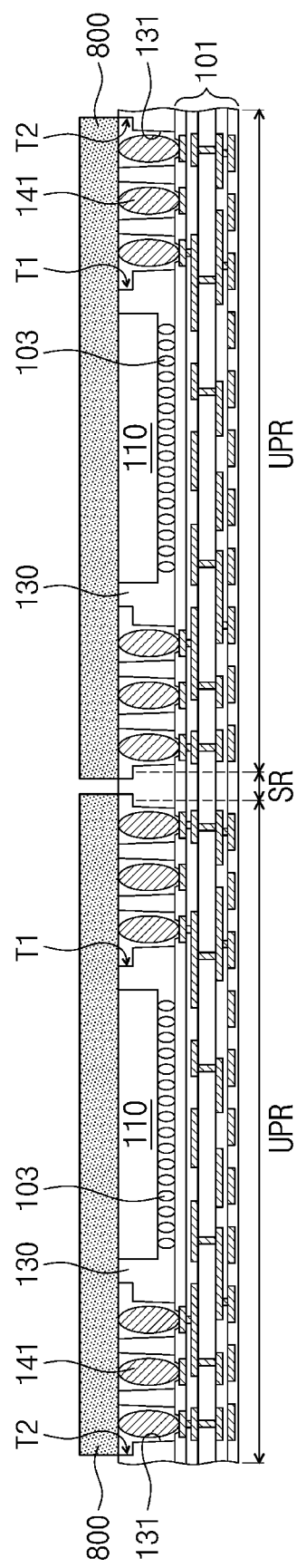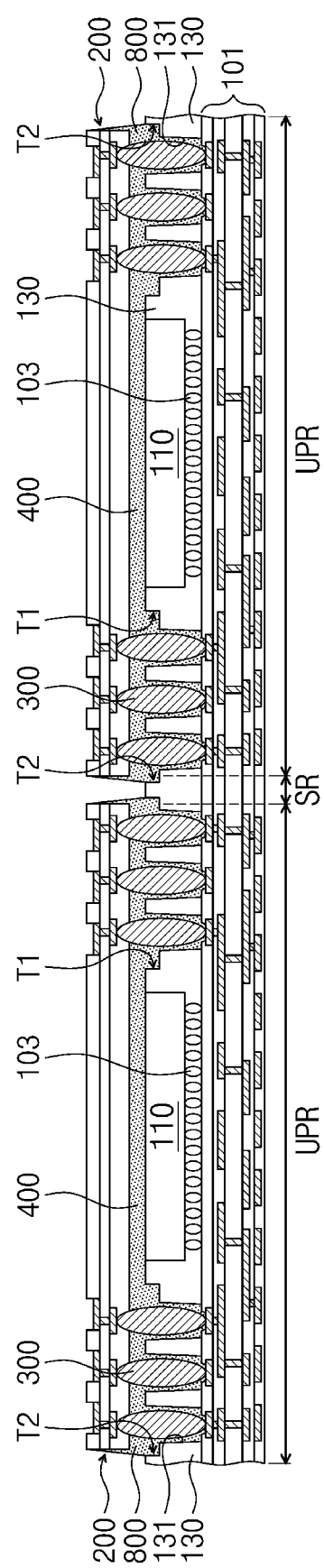

SEMICONDUCTOR PACKAGE

PRIORITY STATEMENT

This is a Continuation of U.S. application Ser. No. 15/818,346, filed Nov. 20, 2017, which issued as U.S. Pat. No. 10,622,340 on Apr. 14, 2020, and a claim of priority under 35 U.S.C. § 119 is made to Korean Patent Application Nos. 10-2016-0155195 and 10-2017-0051203, filed on Nov. 21, 2016 and Apr. 20, 2017, in the Korean Intellectual Property Office, the disclosure of which is hereby incorporated by reference in its entirety.

BACKGROUND

The inventive concepts relate to a semiconductor package and, more particularly, to a semiconductor package having a stack of chips such as a package-on-package (PoP).

As high-capacity, thin and small semiconductor devices and electronic products including the same have become increasingly in demand in the electronics industry, various techniques of packaging chips or die of semiconductor devices been developed. In one of these packaging techniques, various semiconductor chips are stacked to realize a high-density semiconductor device. According to this technique, semiconductor chips having various functions may be integrated on a smaller area, i.e., may have a smaller footprint, than a general package having one semiconductor chip that performs all of such functions.

However, the yield of semiconductor packages manufactured by the packaging technique of stacking a plurality of semiconductor chips tends to be relatively low compared to the yield of semiconductor packages manufactured by the technique of packaging one semiconductor chip. A technique of stacking a package on another package (i.e., a package-on-package (PoP) technique) has been developed to ensure a high product yield of high-density devices.

Since semiconductor packages used in the PoP technique are tested in advance, the failure rate of final products may be reduced. These PoP-type semiconductor packages may be used to achieve miniaturization and provide a multi-function characteristic required for today's electronic portable devices and mobile products.

SUMMARY

According to an aspect of the inventive concepts, a semiconductor package includes a first substrate, a semiconductor chip disposed on the first substrate, a mold layer covering sides of the semiconductor chip and including a through-hole, a second substrate disposed on the semiconductor chip and extending over the mold layer, a connection terminal disposed in the through-hole as interposed between the first substrate and the second substrate, and an underfill resin layer occupying a region between the semiconductor chip and the second substrate and extending contiguously from said region into the through-hole.

According to another aspect of the inventive concepts, a semiconductor package includes a lower package, an upper package disposed on the lower package, an interposer substrate interposed between the lower package and the upper package and including a layer of electrically conductive wiring, an underfill resin layer occupying a region between the lower package and the interposer substrate, and a connection terminal disposed between the lower package and the interposer substrate. The lower package comprises a substrate, a semiconductor chip disposed on the substrate, and a mold layer covering sides of the semiconductor chip and including a through-hole. The connection terminal is disposed in the through-hole and electrically connects the lower package to the interposer substrate, the connection terminal occupies a portion of the through-hole, and the underfill resin layer fills a region of the through-hole that is not occupied by the connection terminal.

According to yet another aspect of the inventive concepts, a semiconductor package includes a first package substrate including a layer of electrically conductive wiring, a first semiconductor chip disposed on the first package substrate, the first package substrate including a first insulating layer and a first layer of electrically conductive wiring, a mold layer covering sides of the semiconductor chip and including through-holes, a second substrate disposed on the first semiconductor chip and extending over the mold layer and including a second insulating layer and a second layer of electrically conductive wiring, a second semiconductor chip disposed on and electrically connected to the second substrate, connection terminals disposed in the through-holes, respectively, and electrically connect the first substrate to the second substrate, and a connection terminal-protecting layer occupying a region between the semiconductor chip and the second substrate and extending contiguously from said region into the through-holes. Each of the connection terminals occupies a portion of a respective one of the through-holes in which it is disposed, and the connection terminal-protecting layer fills regions of the through-holes that are not occupied by the connection terminals.

BRIEF DESCRIPTION OF THE DRAWINGS

The inventive concepts will become more apparent in view of the attached drawings and accompanying detailed description.

FIGS. 10A and 10B are cross-sectional views of semiconductor packages during the course of their manufacture and together illustrate a manufacturing method according to the inventive concepts.

DETAILED DESCRIPTION

Figure 1:
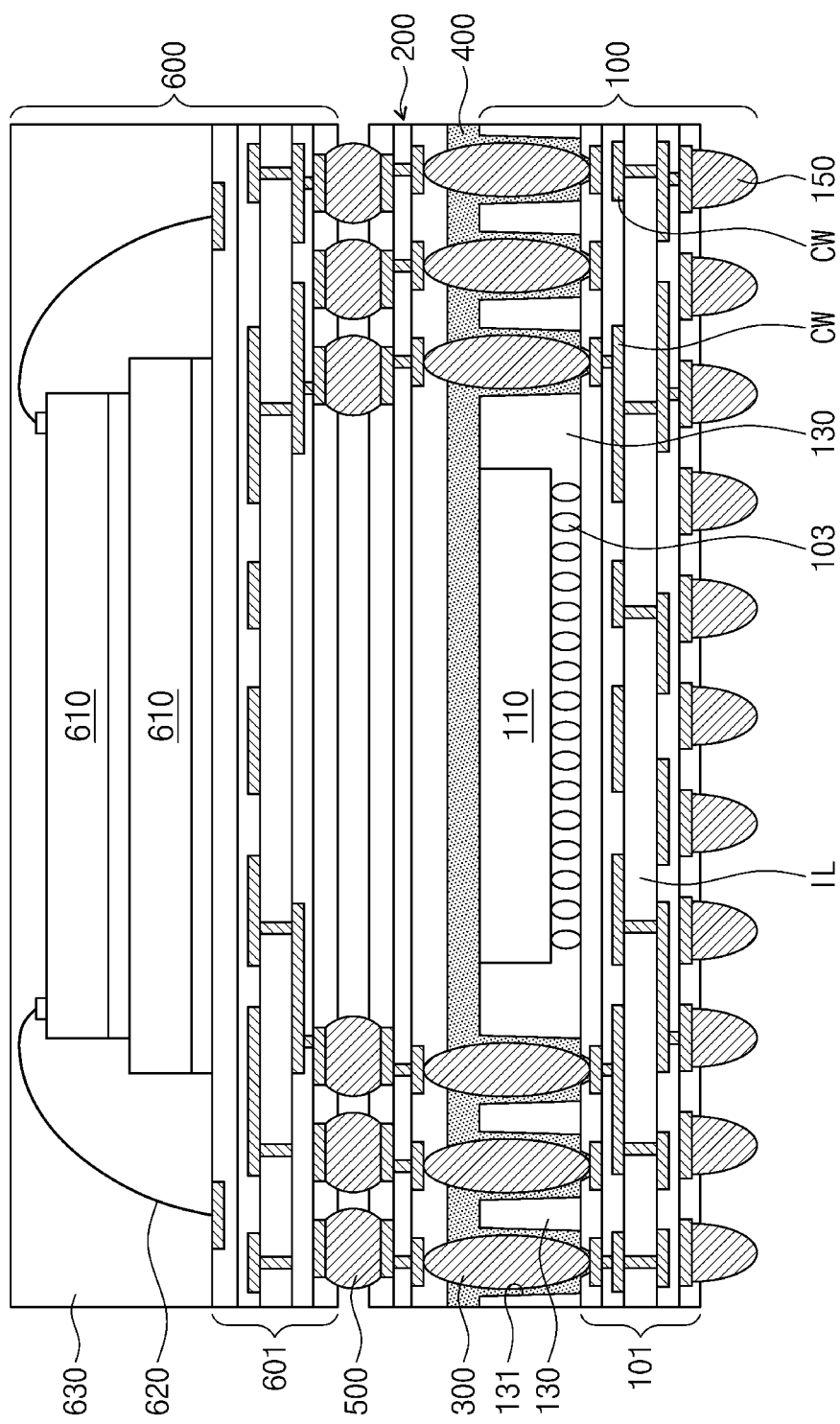
FIG. 1 is a cross-sectional view illustrating an example of a semiconductor package according to the inventive concepts.

FIG. 1 is a cross-sectional view illustrating a semiconductor package according to some examples of the inventive concepts.

Referring to FIG. 1, a semiconductor package may include a lower package 100, an interposer substrate 200, lower connection terminals 300, an underfill resin layer 400, upper connection terminals 500, and an upper package 600.

The lower package 100 may include a lower substrate 101, a lower semiconductor chip 110, a lower mold layer 130, and external terminals 150. The lower substrate 101 may be a printed circuit board (PCB). The lower substrate 101 may include an insulating layer and a layer of electrically conductive wiring thereon. The lower substrate 101 may be a multi-layered PCB. For example, the lower substrate 101 may be referred to as a first package substrate and may include a plurality of stacked insulating layers and internal interconnection lines disposed between the insulating layers, and vias connecting layers of the metal interconnection lines to one another. An exemplary one of the insulating layer, is labeled IL in FIG. 1 and an exemplary set of the metal interconnection lines constituting a first layer of electrically conductive wiring is labeled CW in FIG. 1. Other examples of the lower package 100 described later on and designated by same reference numeral have similar features.

The lower semiconductor chip 110 may be disposed on a top surface of the lower substrate 101. The lower semiconductor chip 110 may be mounted on the top surface of the lower substrate 101 by a flip chip bonding technique.

The lower semiconductor chip 110 may be a logic semiconductor chip or a memory semiconductor chip. Or both a logic semiconductor chip and a memory semiconductor chip may be disposed on a top surface of the lower substrate 101. Otherwise, lower semiconductor chip 110 may be a chip function as a logic semiconductor chip and a memory semiconductor chip. The lower semiconductor chip 110 and the lower substrate 101 may be electrically connected to each other through chip connection parts 103 disposed between the lower semiconductor chip 110 and the top surface of the lower substrate 101. The chip connection parts 103 may include, for example, solder balls.

The lower mold layer 130 may be disposed on sidewalls of the lower semiconductor chip 110. For example, the lower mold layer 130 may be disposed on the lower substrate 101 to cover the sidewalls of the lower semiconductor chip 110. The lower mold layer 130 may include an epoxy mold compound (EMC), an epoxy-based resin, or polyimide. The lower mold layer 130 may further include a silica filler.

A top surface of the lower mold layer 130 may be substantially coplanar with a top surface of the lower semiconductor chip 110. The lower mold layer 130 may fill a space between the lower substrate 101 and the lower semiconductor chip 110. The lower mold layer 130 may have through-holes 131. The through-holes 131 may be arranged to surround the lower semiconductor chip 110 when viewed in a plan view. Portions of the top surface of the lower substrate 101 may be exposed by the through-holes 131. For example, surfaces defining bottom of the through-holes 131 may correspond to the portions of the top surface of the lower substrate 101.

The external terminals 150 may be disposed on a bottom surface of the lower substrate 101. The external terminals 150 may be electrically connected to the lower semiconductor chip 110 through the internal interconnection lines of the lower substrate 101. The external terminals 150 may include, for example, solder balls.

The interposer substrate 200 may be disposed on the lower package 100. The interposer substrate 200 may electrically connect the lower package 100 to the upper package 600. The interposer substrate 200 may include an insulating layer and a layer of electrically conductive wiring thereon. The interposer substrate 200 may be multi-layered. For example, the interposer substrate 200 may include insulating layers and metal interconnection lines, which are alternately stacked, and vias connecting layers of the metal interconnection lines to one another.

The lower connection terminals 300 may be disposed between the interposer substrate 200 and the lower substrate 101. The lower connection terminals 300 may electrically connect the lower package 100 to the interposer substrate 200. The lower connection terminals 300 may be provided in the through-holes 131. In some examples, the lower connection terminals 300 protrude upward from the through-holes 131. In other words, the lower connection terminals 300 may have protruding portions above the level of the top surface of the lower mold layer 130. In some examples, sidewalls of the lower connection terminals 300 disposed in the through-holes 131 may be spaced apart from inner wall surfaces defining the sides of the through-holes 131. The lower connection terminals 300 may include at least one of tin (Sn), lead (Pb), nickel (Ni), gold (Au), silver (Ag), copper (Cu), and bismuth (Bi).

The underfill resin layer 400 may be disposed between the lower package 100 and the interposer substrate 200. The underfill resin layer 400 may fill a space between the lower semiconductor chip 110 and the interposer substrate 200, a space between the lower mold layer 130 and the interposer substrate 200, and regions of the through-holes 131 not occupied by the lower connection terminals 300. For example, the underfill resin layer 400 may extend contiguously from the region between the lower semiconductor chip 110 and the interposer substrate 200 into the region between the lower mold layer 130 and the interposer substrate 200 within the through-holes 131. The underfill resin layer 400 may surround the lower connection terminals 300. For example, the underfill resin layer 400 may cover outer circumferential surfaces (referred to hereinafter as "sidewalls") of the lower connection terminals 300. In more detail, each of the lower connection terminals 300 may include the protruding portion situated above the level of the top surface of the lower mold layer 130, and a lower portion situated beneath the level of the top surface of the lower mold layer 130 (i.e., disposed in the through-hole 131). The underfill resin layer 400 may cover sidewalls of the protruding portions of the lower connection terminals 300 and sidewalls of the lower portions of the lower connection terminals 300. The underfill resin layer 400 may be in contact with the top surface of the lower semiconductor chip 110, the top surface of the lower mold layer 130, and the inner wall surfaces defining the sides of the through-holes 131. The underfill resin layer 400 may be formed of an epoxy-based resin, benzocyclobutene or polyimide. The underfill resin layer 400 may further include a silica filler. In certain examples, the underfill resin layer 400 includes an adhesive and a flux. The flux may include an oxide-removing agent. In certain examples, the underfill resin layer 400 includes a silica filler or a flux. In certain examples, the underfill resin layer 400 includes non-conductive paste.

According to the examples of the inventive concepts, the underfill resin layer 400 disposed between the lower package 100 and the interposer substrate 200 surrounds outer circumferential surfaces of the lower connection terminals 300 to support the lower connection terminals 300. Stress occurring between the lower package 100 and the interposer substrate 200 may be applied to the lower connection terminals 300. However, the underfill resin layer 400 reduces the stress otherwise applied to the lower connection terminals 300, and thus may serve as a connection terminal-protecting layer to prevent or inhibit a crack from occurring in the lower connection terminals 300.

The upper package 600 may be disposed on the interposer substrate 200. The upper package 600 may include an upper substrate 601, upper semiconductor chips 610, bonding wires 620, and an upper mold layer 630. The upper substrate 601 may be a printed circuit board (PCB). The upper substrate 601 may include an insulating layer and a layer of electrically conductive wiring thereon. The upper substrate 601 may be a multi-layered PCB. For example, the upper substrate 601 may include a plurality of stacked insulating layers and internal interconnection lines disposed between the insulating layers, and vias electrically connecting layers of the interconnection lines to one another.

The upper semiconductor chips 610 may be sequentially stacked one on another on a top surface of the upper substrate 601. The upper semiconductor chips 610 may be fixed on the top surface of the upper substrate 601 by adhesive layers. For example, each of the upper semiconductor chips 610 may be a logic semiconductor chip or a memory semiconductor chip. The upper semiconductor chips 610 may be the same kind of semiconductor chips or different kinds of semiconductor chips. In the present example, the upper package 600 includes two upper semiconductor chips 610. However, the inventive concepts are not limited to the upper package 600 having any particular number of upper semiconductor chips 610.

The bonding wires 620 may electrically connect the upper semiconductor chips 610 to the upper substrate 601. In the present example, the upper semiconductor chips 610 are mounted on the upper substrate 601 by a wire bonding technique using the bonding wires 620. However, examples of the inventive concepts are not limited thereto. In certain examples, the upper semiconductor chips 610 are mounted on the upper substrate 601 by a flip chip bonding technique. The upper mold layer 630 may be disposed on the upper substrate 601. The upper mold layer 630 may cover the upper semiconductor chips 610 and the bonding wires 620.

Figure 2A:
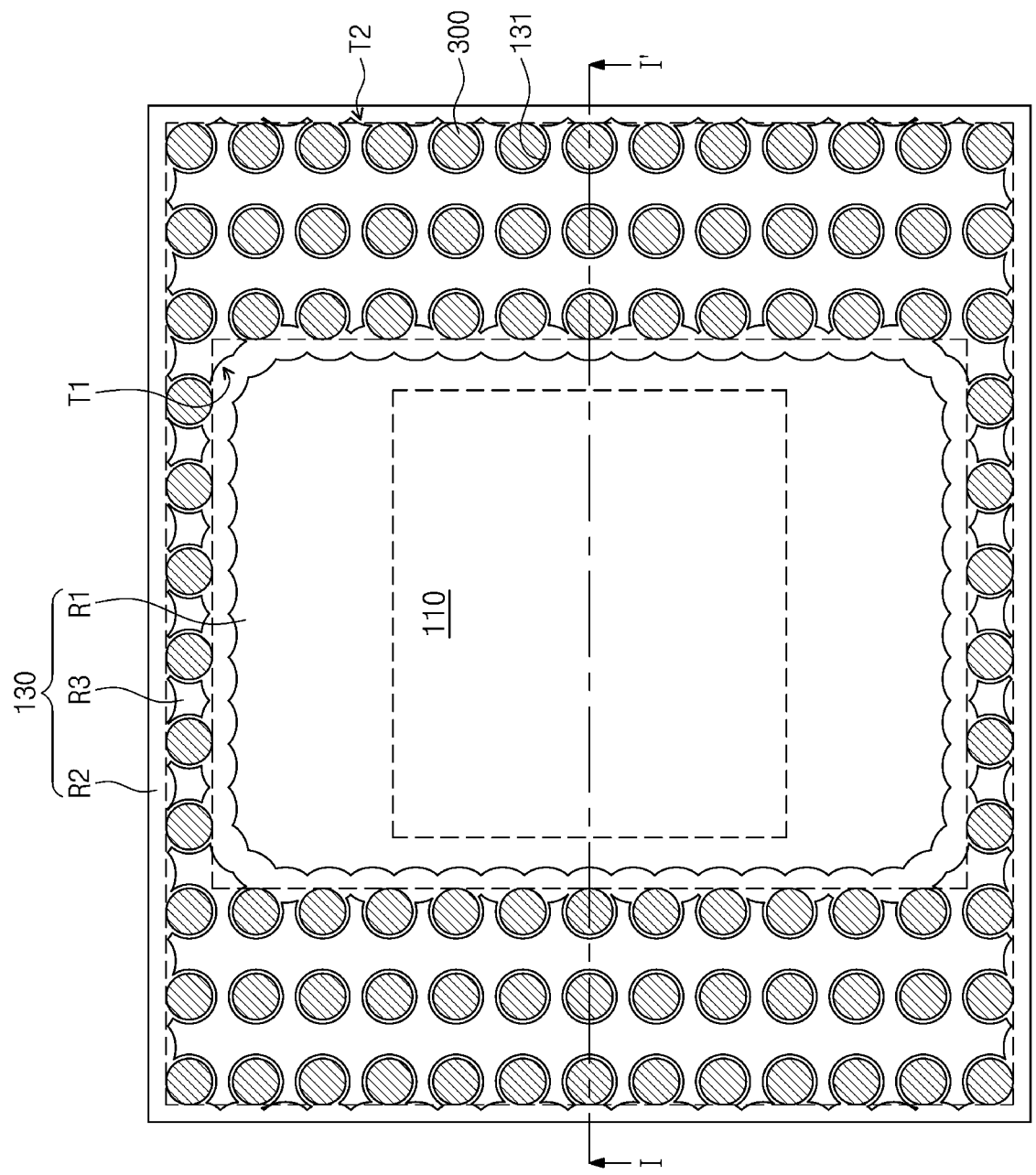
FIG. 2A is a plan view illustrating examples of a semiconductor package according to the inventive concepts.
Figure 2B:
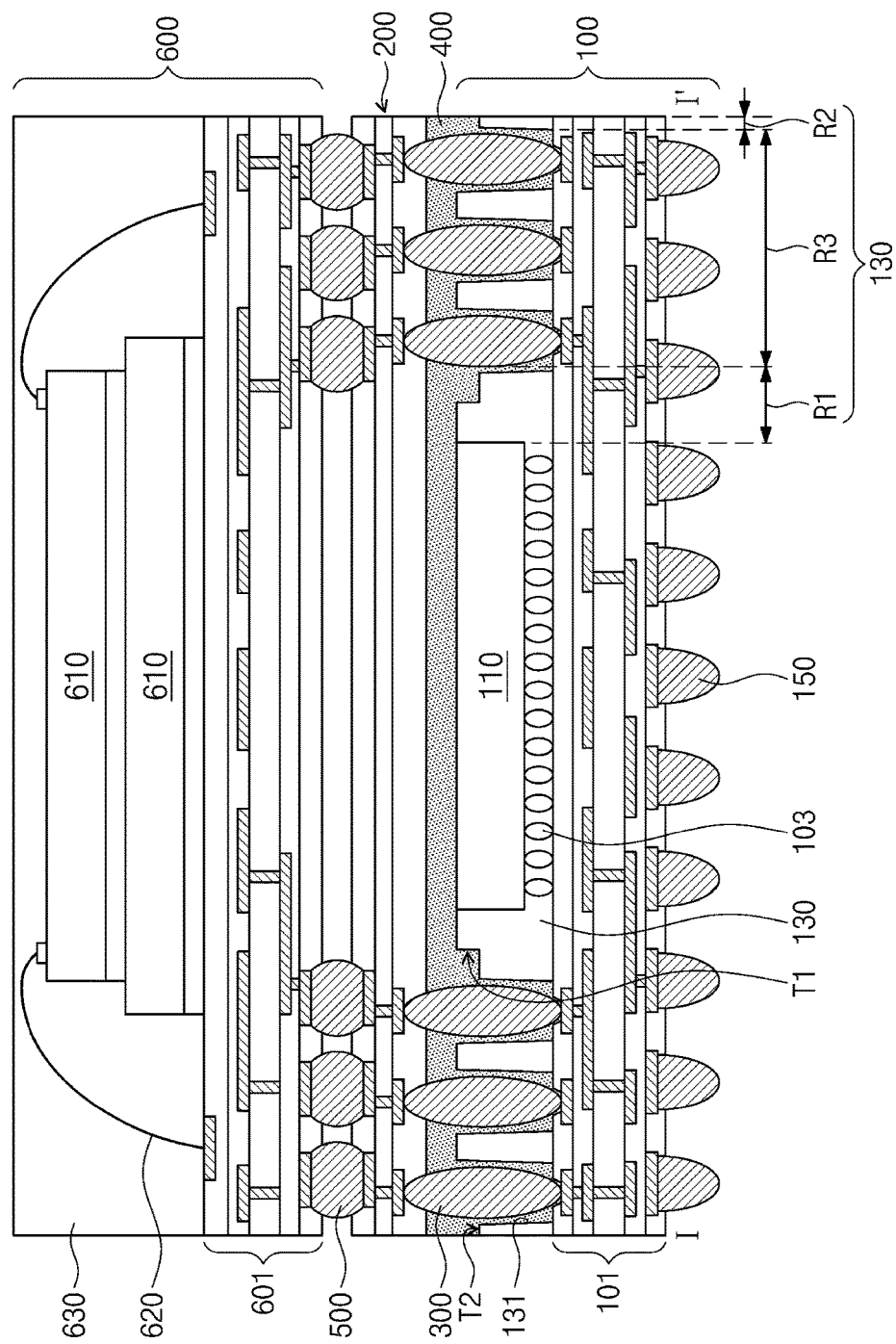
FIG. 2B is a cross-sectional view of an example the semiconductor package of FIG. 2A taken along line I-I'.

FIG. 2A is a plan view illustrating a semiconductor package according to some examples of the inventive concepts. FIG. 2B is a cross-sectional view taken along a line I-I' of FIG. 2A. Hereinafter, the same elements as described in the above examples will be indicated by the same reference numerals or the same reference designators. In addition, the descriptions of the same elements as in the above examples will be omitted or mentioned briefly for the sake of brevity.

Referring to FIGS. 2A and 2B, the lower mold layer 130 may include a first region R1, a second region R2, and a third region R3. The first region R1 of the lower mold layer 130 may be disposed between the lower semiconductor chip 110 and the lower connection terminals 300. For example, the first region R1 of the lower mold layer 130 may be disposed between the lower semiconductor chip 110 and the lower connection terminals 300 closest to the lower semiconductor chip 110. In other words, the lower connection terminals 300 may not be disposed in the first region R1 of the lower mold layer 130. The second region R2 of the lower mold layer 130 may be disposed at a side of the first region R1 of the lower mold layer 130. The second region R2 of the lower mold layer 130 may correspond to an edge region of the lower mold layer 130, i.e., may include the outer peripheral portion of the lower mold layer 130. The lower connection terminals 300 may not be disposed in the second region R2 of the lower mold layer 130. The third region R3 of the lower mold layer 130 may be disposed between the first region R1 and the second region R2. The lower connection terminals 300 may be disposed in the third region R3 of the lower mold layer 130.

The lower mold layer 130 may include a first extension trench T1. The first extension trench T1 may be formed in the first region R1 of the lower mold layer 130. For example, the first extension trench T1 may be disposed between the lower semiconductor chip 110 and the lower connection terminals 300 closest to the lower semiconductor chip 110. The first extension trench T1 may have a line or ring shape and extend between the lower semiconductor chip 110 and the lower connection terminals 300 closest to the lower semiconductor chip 110. The first extension trench T1 may be open to, and more specifically, may open into upper portions of the through-holes 131 in which the lower connection terminals 300 closest to the lower semiconductor chip 110 are provided. Thus, sum of the width of an upper portion of each through-hole 131 (diameter of the through-hole in the case of a circular through-hole) and the width of the first extension trench T1 open thereto may be greater than the width of the lower portion of the through-hole 131.

The lower mold layer 130 thus may be recessed, by virtue of the first extension trench T1, from the top surface of the lower semiconductor chip 110. That is, a surface lower of the mold layer 130 defining the bottom of the first extension trench T1 may be disposed at a level that is lower than the top surface of the lower semiconductor chip 110 and is higher than the bottoms of the through-holes 131. The bottom of the first extension trench T1 may be lower than a top surface of a portion of first region R1 of the lower mold layer 130 disposed between the first extension trench T1 and the lower semiconductor chip 110 and may be lower than a top surface of the third region R3 of the lower mold layer 130.

The lower mold layer 130 may include a second extension trench T2. The second extension trench T2 may be formed in the second region R2 of the lower mold layer 130. For example, the second extension trench T2 may be disposed between outer sidewalls of the lower mold layer 130 and the lower connection terminals 300 closest to the outer sidewalls of the lower mold layer 130. The second extension trench T2 may have a line or ring shape and extend between the outer sidewalls of the lower mold layer 130 and the lower connection terminals 300 closest to the outer sidewalls of the lower mold layer 130. The second extension trench T2 may open to upper portions of the through-holes 131 in which the lower connection terminals 300 closest to the outer sidewalls of the lower mold layer 130 are provided. Thus, the sum of widths of an upper portion of each through-hole 131 and the second extension trench T2 open thereto may be greater than width of the lower portion of the through-hole 131.

The lower mold layer 130 may be recessed from the top surface of the lower semiconductor chip 110 by virtue of the second extension trench T2. That is, a surface of the lower mold layer 130 defining the bottom the second extension trench T2 may be disposed at a level that is lower than the top surface of the lower semiconductor chip 110 and is higher than bottoms of the through-holes 131. The bottom of the second extension trench T2 may be disposed at a lower level than the top surface of the third region R3 of the lower mold layer 130. In some examples, therefore, heights of the outer sidewalls of the lower mold layer 130 may be less than the distance from the top surface of the lower substrate 101 to the top surface of the lower semiconductor chip 110.

The underfill resin layer 400 may fill the first extension trench T1 and the second extension trench T2. The underfill resin layer 400 may be in contact with the surfaces defining (the bottom and side of) the first extension trench T1 and (the bottom of) the second extension trench T2.

Figure 3A:
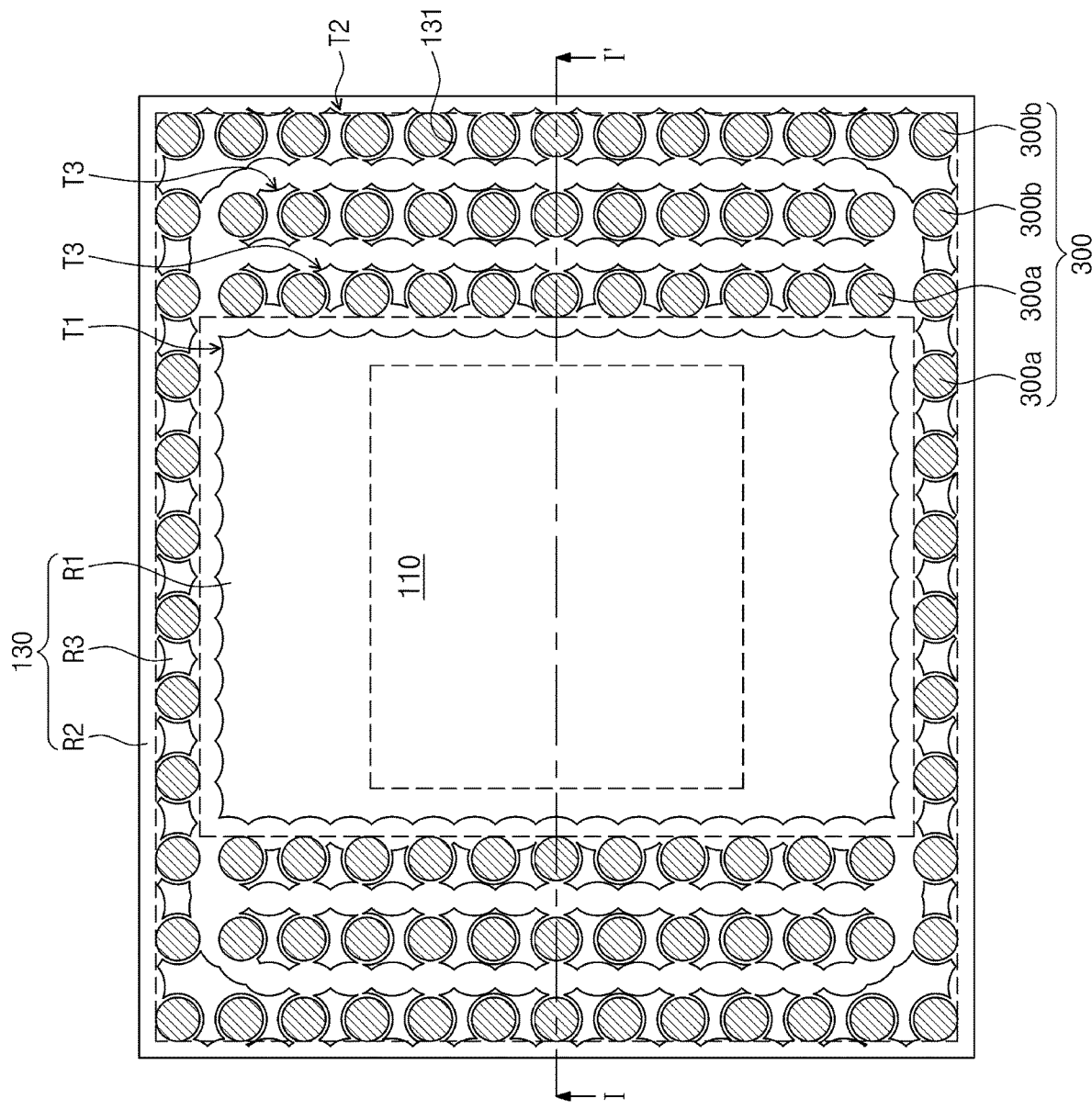
FIG. 3A is a plan view illustrating examples of a semiconductor package according to the inventive concepts.
Figure 3B:
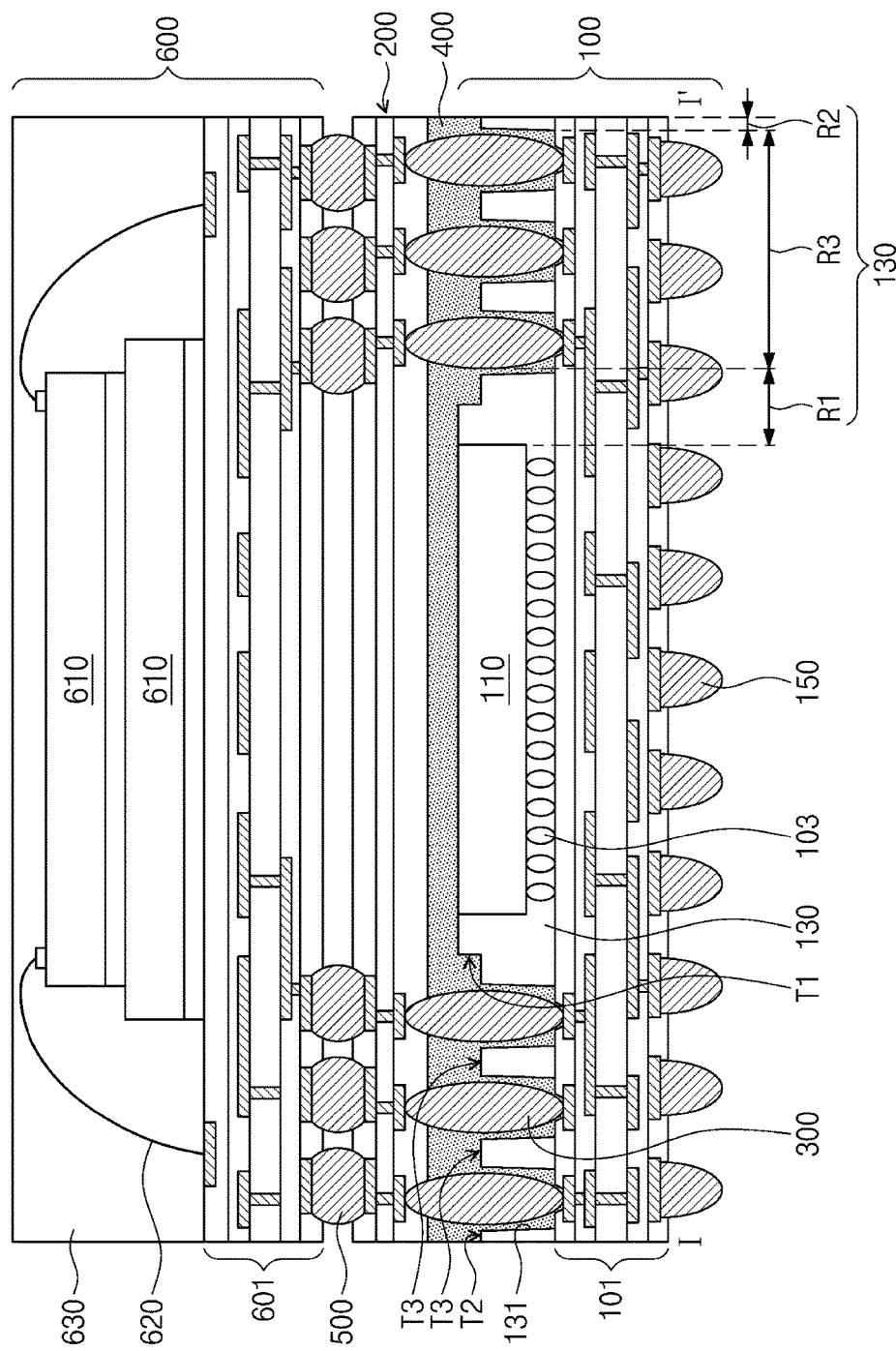
FIG. 3B is a cross-sectional view of an example of the semiconductor package of FIG. 3A taken along line I-I'.

FIG. 3A is a plan view illustrating a semiconductor package according to some examples of the inventive concepts. FIG. 3B is a cross-sectional view taken along a line I-I' of FIG. 3A. Hereinafter, the same elements as described in the above examples will be indicated by the same reference numerals or the same reference designators. In addition, the descriptions to the same elements as in the above examples will be omitted or mentioned briefly for the sake of brevity.

Referring to FIGS. 3A and 3B, lower connection terminals 300 may include first lower connection terminals 300a and second lower connection terminals 300b. The first lower connection terminals 300a may be arranged to surround the lower semiconductor chip 110 when viewed in a plan view. The second lower connection terminals 300b may be disposed at a side of the first lower connection terminals 300a.

The first extension trench T1 may be disposed in the first region R1 of the lower mold layer 130. For example, the first extension trench T1 may be disposed between the lower semiconductor chip 110 and the first lower connection terminals 300a. The second extension trench T2 may be disposed in the second region R2 of the lower mold layer 130. For example, the second extension trench T2 may extend from between one outer sidewall of the lower mold layer 130 and the second lower connection terminals 300b closest to the one outer sidewall of the lower mold layer 130 into between another outer sidewall of the lower mold layer 130 and the first lower connection terminals 300a closest to the another outer sidewall of the lower mold layer 130. The another outer sidewall of the lower mold layer 130 may extend in a direction intersecting (e.g. perpendicular to) the one outer sidewall of the lower mold layer 130.

The lower mold layer 130 may include third extension trenches T3. The third extension trenches T3 may be disposed in the third region R3 of the lower mold layer 130. For example, one of the third extension trenches T3 may be disposed between the first lower connection terminals 300a and the second lower connection terminals 300a adjacent to the first lower connection terminals 300a and may extend (longitudinally) in one direction (e.g., top to bottom in FIG. 3A). Another of the third extension trenches T3 may be disposed between the second lower connection terminals 300b adjacent to each other and may extend in the one direction (e.g., top to bottom in FIG. 3A). The one of the third extension trenches T3 may open to the through-holes 131 provided with the first lower connection terminals 300a adjacent thereto and the through-holes 131 provided with the second lower connection terminals 300b adjacent thereto. The another of the third extension trenches T3 may be open to the through-holes 131 provided with the second lower connection terminals 300b adjacent thereto. The sum of the widths of the upper portion of each of the through-holes 131 and the third extension trench(es) T3 open thereto may be greater than the width of the lower portion of the through-holes 131.

In some examples, the first and third extension trenches T1 and T3 may meet each other so as to be open to each other. In other words, the first and third extension trenches T1 and T3 meeting each other may be considered to constitute one trench. The second extension trench T2 may be spaced apart from the first and third extension trenches T1 and T3 but may be connected to the first and third extension trenches T1 and T3 through the through-holes 131. In certain other examples, even though not shown in the drawings, the first to third extension trenches T1, T2, and T3 may be spaced apart from each other but may be connected to each other through the through-holes 131.

The underfill resin layer 400 may fill the first extension trench T1, the second extension trench T2, and the third extension trenches T3. The underfill resin layer 400 may be in contact with surfaces defining (the bottom and side of) the first extension trench T1, (the bottom of) the second extension trench T2, and (the bottom of) the third extension trenches T3.

Figure 4A:
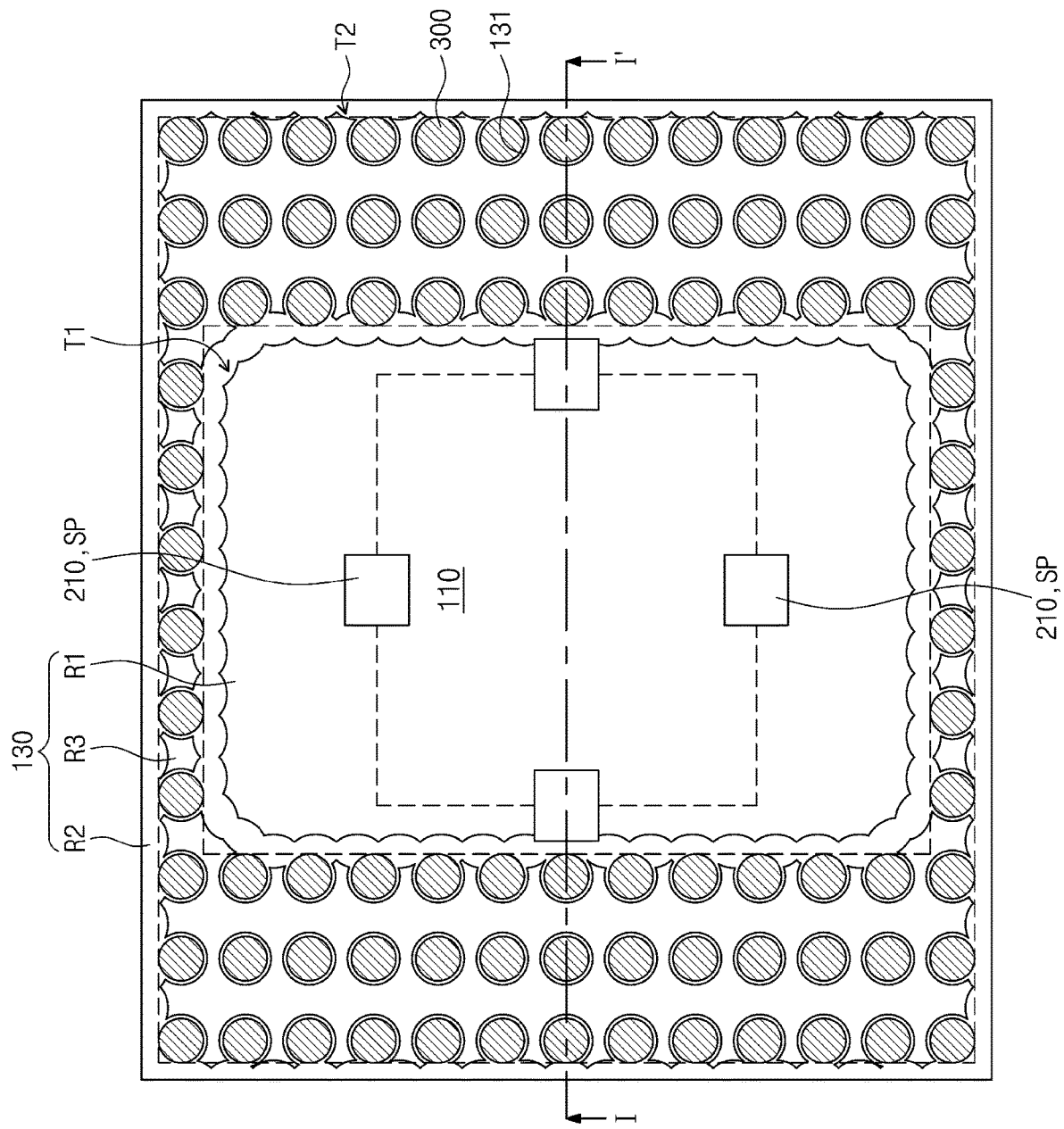
FIG. 4A is a plan view illustrating examples of a semiconductor package according to the inventive concepts.
Figure 4B:
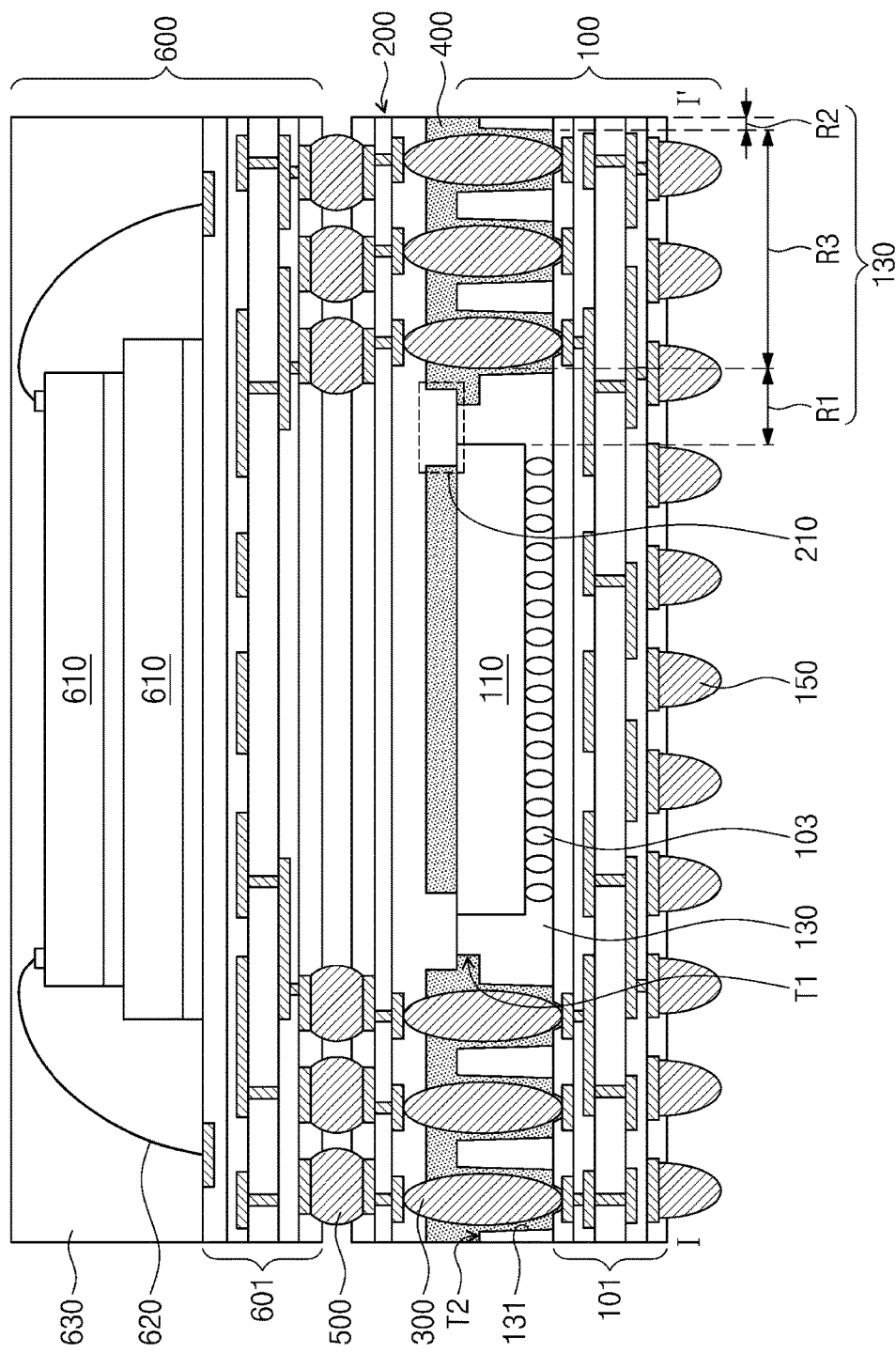
FIGS. 4B and 4C are cross-sectional views of examples of semiconductor packages of FIG. 4A taken along line I-I'.

FIG. 4A is a plan view illustrating a semiconductor package according to some examples of the inventive concepts. FIG. 4B is a cross-sectional view taken along a line I-I' of FIG. 4A. Hereinafter, the same elements as described in the above examples will be indicated by the same reference numerals or the same reference designators, and the descriptions thereto will be omitted for the sake of brevity.

Referring to FIGS. 4A and 4B, the interposer substrate 200 may include protrusions 210 protruding from a bottom surface of the interposer substrate 200. The protrusions 210 may extend from the bottom surface of the interposer substrate 200 into the underfill resin layer 400 so as to be in contact with the top surface of the lower semiconductor chip 110. For example, the protrusions 210 may extend from the bottom surface of the interposer substrate 200 into the underfill resin layer 400 and may have a surface coplanar with an interface (or a boundary) between the lower semiconductor chip 110 and the lower mold layer 130. The protrusions 210 may be in contact with portions of the top surface of the lower semiconductor chip 110 and portions of the top surface of the first region R1 of the lower mold layer 130. The protrusions 210 may be spaced apart from each other. The protrusions 210 may establish or maintain a distance between the lower package 100 and the interposer substrate 200. The protrusions 210 may be unitary parts of a layer of the interposer substrate 200, i.e., a lowermost layer of the interposer substrate 200. For example, the protrusions 210 may include the same material as the lowermost one of the stacked layers of the interposer substrate 200. Thus, the protrusions 210 may include an insulating material, e.g., a photo solder resist (PSR).

Figure 4C:
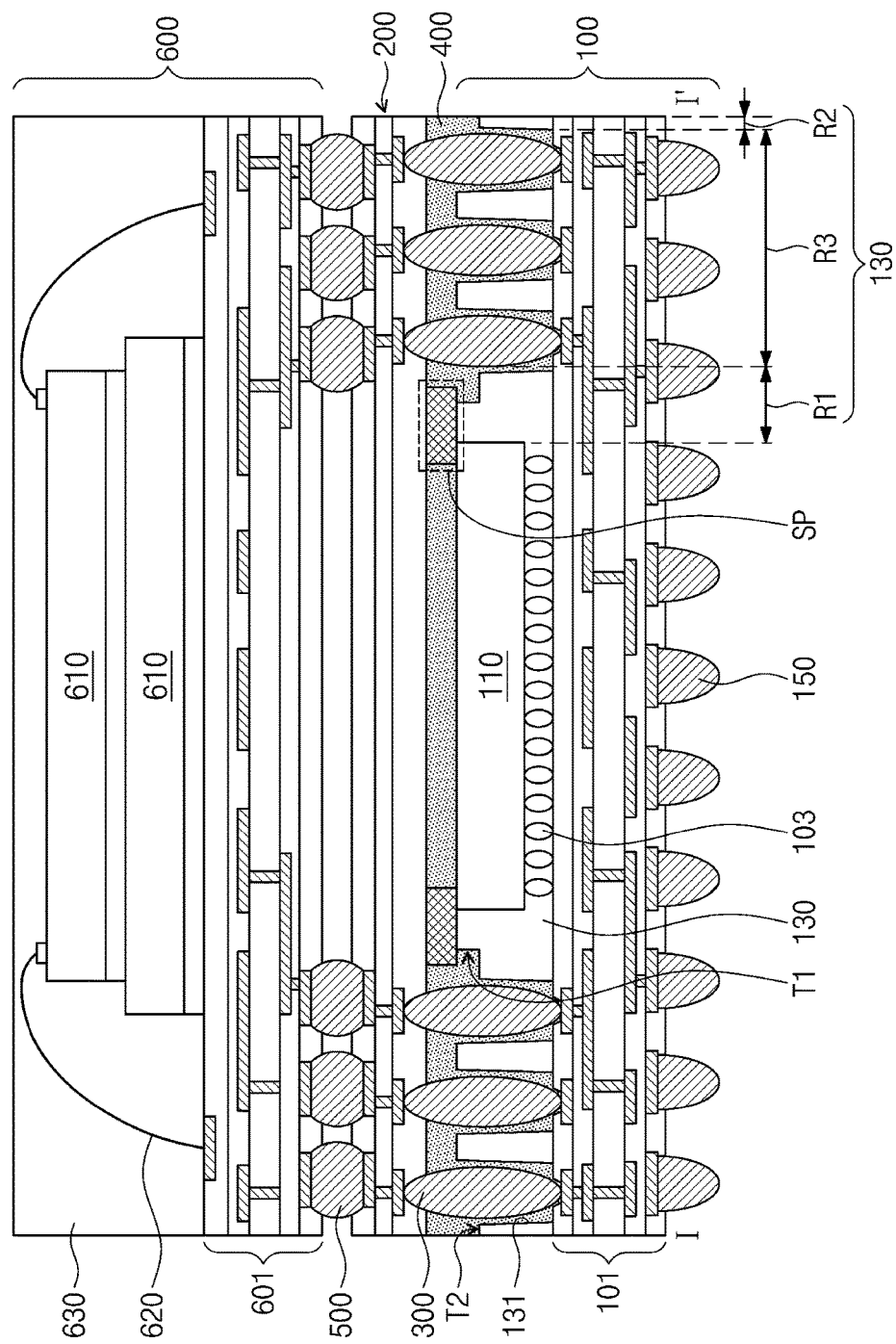

FIG. 4C is a cross-sectional view taken along the line I-I' of FIG. 4A to illustrate a semiconductor package according to some examples of the inventive concepts. Hereinafter, the same elements as described in the above examples will be indicated by the same reference numerals or the same reference designators, and the descriptions thereto will be omitted for the sake of brevity.

Referring to FIG. 4C, support patterns SP may be disposed between the lower package 100 and the interposer substrate 200. The support patterns SP may be spaced apart from each other. The support patterns SP may have bottom surfaces coplanar with the interface (or the boundary) between the lower mold layer 130 and the lower semiconductor chip 110. The support patterns SP may be in contact with portions of the top surface of the lower semiconductor chip 110, portions of the top surface of the first region R1 of the lower mold layer 130, and portions of the bottom surface of the interposer substrate 200. The support patterns SP may establish or maintain a distance between the lower package 100 and the interposer substrate 200. The support patterns SP may include an epoxy-based resin or a metal material (e.g., copper).

Figure 5A:
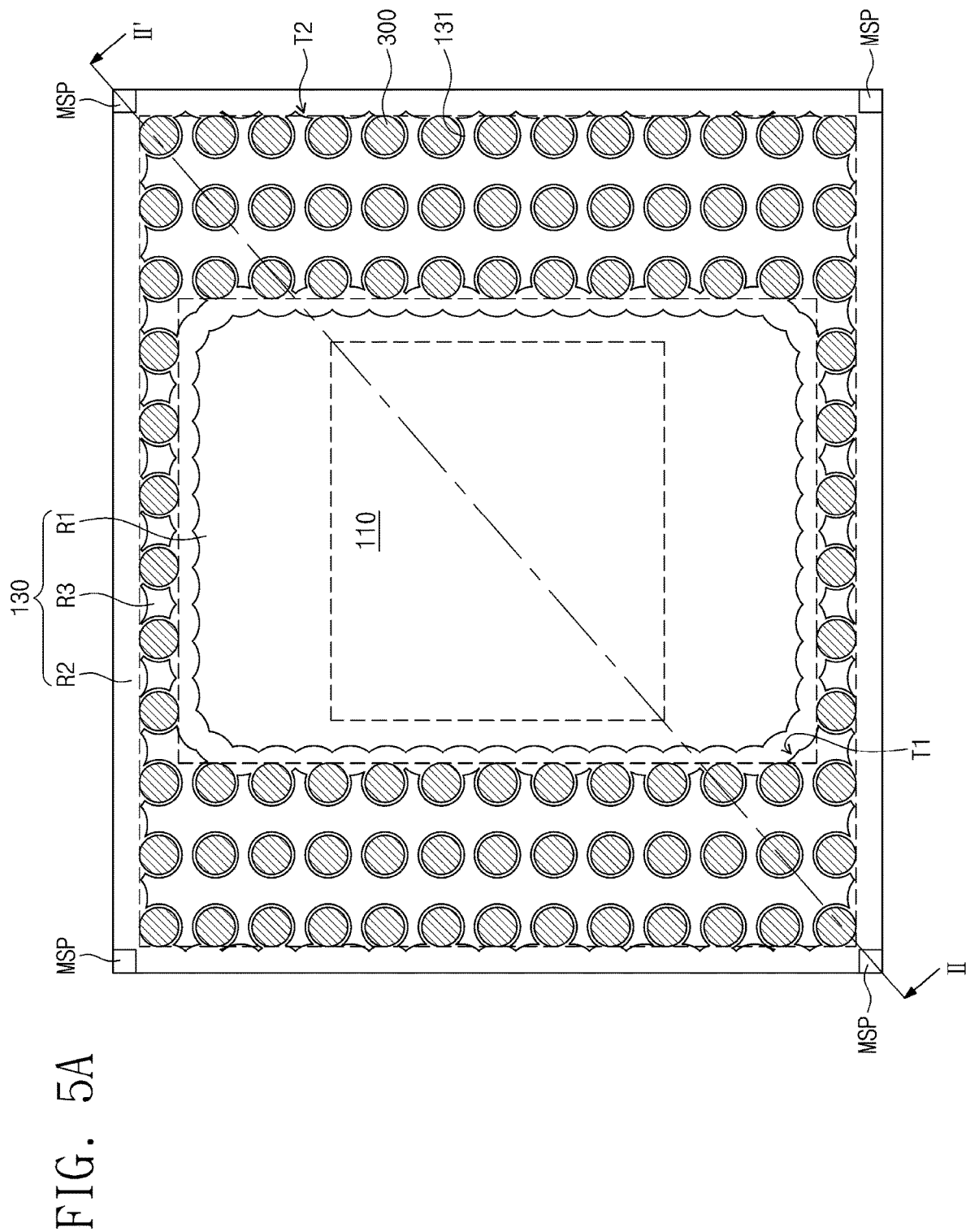
FIG. 5A is a plan view illustrating examples of a semiconductor package according to the inventive concepts.
Figure 5B:
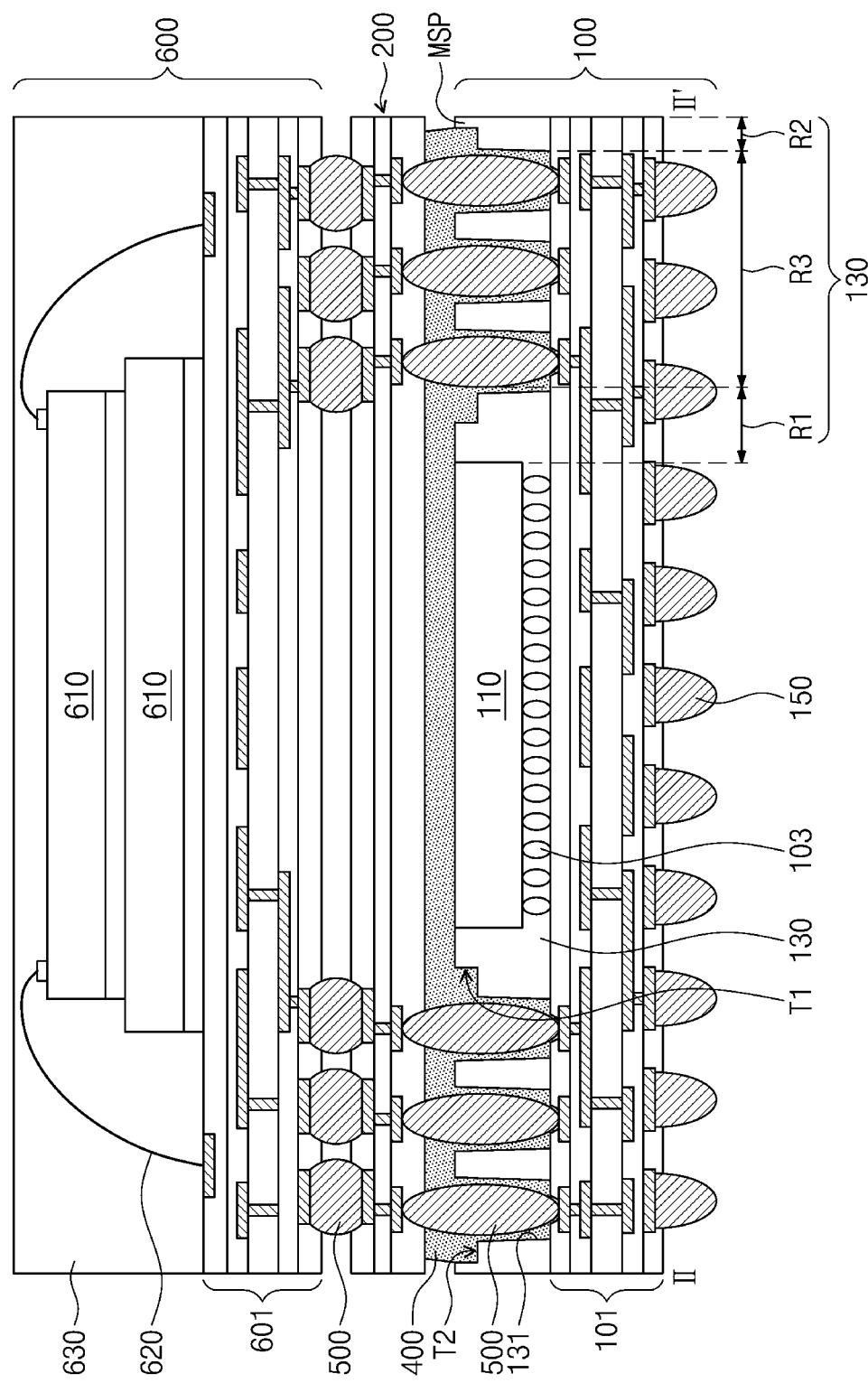
FIG. 5B is a cross-sectional view of an example of a semiconductor package of FIG. 5A taken along line II-IP.

FIG. 5A is a plan view illustrating a semiconductor package according to some examples of the inventive concepts. FIG. 5B is a cross-sectional view taken along line II-II' of FIG. 5A. Hereinafter, the same elements as described in the above examples will be indicated by the same reference numerals or the same reference designators, and the descriptions thereto will be omitted for the sake of brevity.

Referring to FIGS. 5A and 5B, the lower mold layer 130 may include mold support patterns MSP protruding from a top surface of the lower mold layer 130. The mold support patterns MSP may be unitary with the other portions of the lower mold layer 130. The mold support patterns MSP may be disposed in the second extension trench T2. The mold support patterns MSP may be disposed at corners of the lower mold layer 130. In some examples, vertexes of the interposer substrate 200, at which the bottom surface and outer sidewalls of the interposer substrate 200 meet each other, may overlap top surfaces of the mold support patterns MSP as viewed in a plan view. In a case in which the interposer substrate 200 is bent such that its top surface has a convex shape, the vertexes of the interposer substrate 200 may meet the top surfaces of the mold support patterns MSP to establish or secure distances between end portions of the lower package 100 and end portions of the interposer substrate 200.

Figure 6:
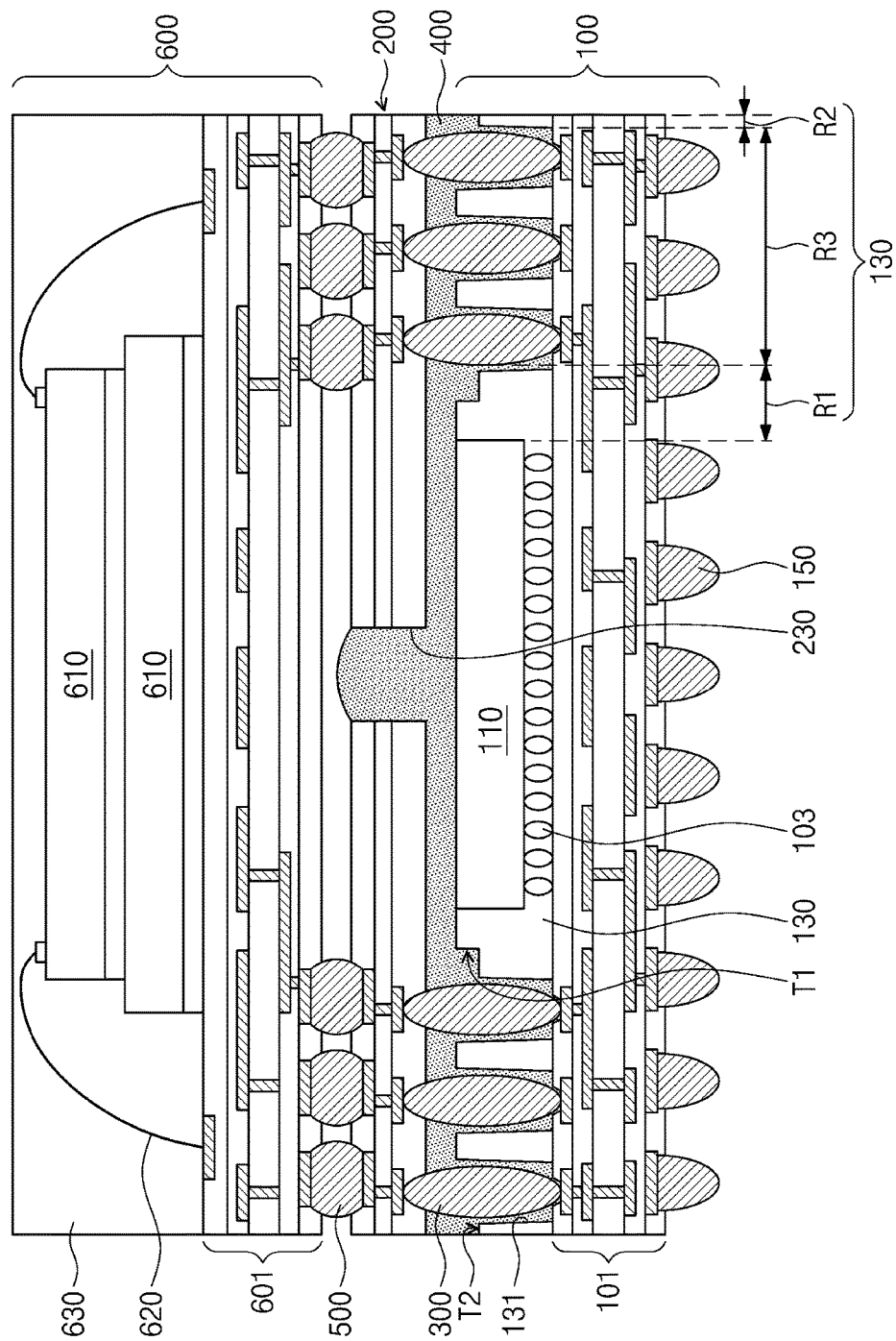
FIG. 6 is a cross-sectional view illustrating a semiconductor package according to the inventive concepts.

FIG. 6 is a cross-sectional view illustrating a semiconductor package according to some examples of the inventive concepts. Hereinafter, the same elements as described in the above examples will be indicated by the same reference numerals or the same reference designators, and the descriptions thereto will be omitted for the sake of brevity.

Referring to FIG. 6, the interposer substrate 200 may include a through portion 230 (opening extending through the layers of the interposer substrate). The through portion 230 may be an empty region. The through portion 230 may be disposed in a central portion of the interposer substrate 200. A portion of the underfill resin layer 400 may be exposed through the through portion 230. The underfill resin layer 400 may fill the through portion 230. In some examples, the underfill resin layer 400 filling the through portion 230 protrudes upwardly from the top surface of the interposer substrate 200, and thus a top surface of the underfill resin layer 400 filling the through portion 230 may be disposed at a higher level than the top surface of the interposer substrate 200.

Figure 7:
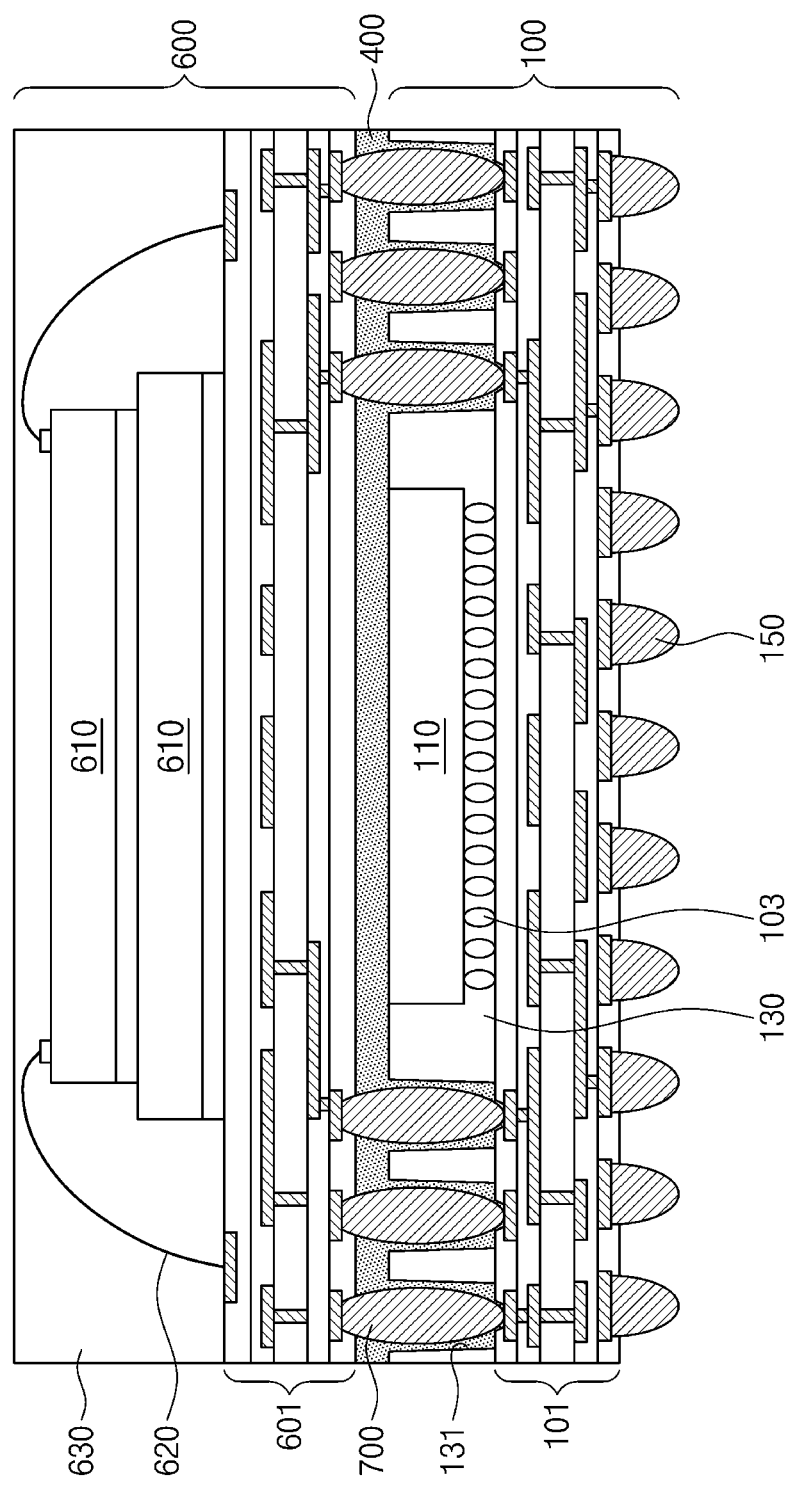
FIG. 7 is a cross-sectional view illustrating a semiconductor package according to the inventive concepts.

FIG. 7 is a cross-sectional view illustrating a semiconductor package according to some examples of the inventive concepts. Hereinafter, the same elements as described in the above examples will be indicated by the same reference numerals or the same reference designators, and the descriptions thereto will be omitted for the sake of brevity.

Referring to FIG. 7, a semiconductor package may include the lower package 100, the underfill resin layer 400, connection terminals 700, and the upper package 600.

The connection terminals 700 may be disposed between the lower package 100 and the upper package 600 and may function as a connection path electrically connecting the lower package 100 to the upper package 600. The connection terminals 700 may be provided in the through-holes 131 of the lower mold layer 130. The underfill resin layer 400 may fill a space between the lower semiconductor chip 110 and the upper substrate 601, a space between the upper substrate 601 and the lower mold layer 130, and portions of the through-holes 131 not occupied by the connection terminals 700. The underfill resin layer 400 may surround sidewalls of the connection terminals 700.

In addition, the mold layer 130 and the underfill resin layer 400 of the semiconductor package shown in FIG. 7 may incorporate any of the features associated with the mold layer 130 and the underfill resin layer 400 described above with reference to the examples of FIGS. 2A, 2B-FIG. 6, e.g., extension trenches in the mold layer 130 and/or spacers or mold support patterns MSP.

FIGS. 8A to 8D illustrate a method of manufacture according to the inventive concepts.

Figure 8A:
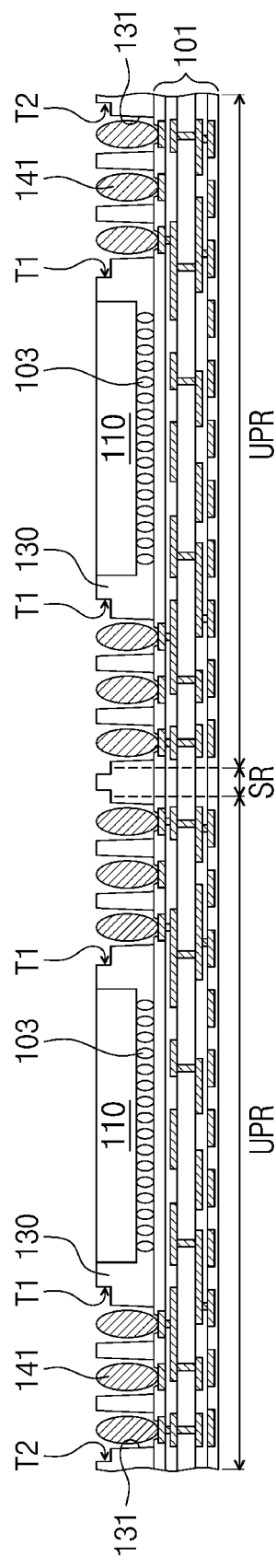
FIGS. 8A, 8B, 8C and 8D are cross-sectional views of semiconductor packages during the course of their manufacture and together illustrate a manufacturing method according to the inventive concepts.

Referring to FIG. 8A, lower semiconductor chips 110 may be mounted on a top surface of a lower substrate 101. The lower substrate 101 may be a printed circuit board (PCB). For example, the lower substrate 101 may include a plurality of stacked insulating layers and internal interconnection lines (layer of wiring) disposed between the insulating layers. The lower substrate 101 may include unit package regions UPR and a scribing region SR. The scribing region SR may be disposed between the unit package regions UPR. Also, each of the unit package regions UPR may be surrounded by the scribing region SR when viewed in a plan view. One lower semiconductor chip 110 may be mounted on each of the unit package regions UPR. Each of the lower semiconductor chips 110 may be a logic semiconductor chip or a memory semiconductor chip. The lower semiconductor chips 110 may be mounted on top surfaces of the unit package regions UPR of the lower substrate 101 by a flip chip-bonding technique. The lower semiconductor chips 110 may be adhered to the top surface of the lower substrate 101 by chip connection parts 103. In other words, the chip connection parts 103 may be formed between the lower substrate 101 and the lower semiconductor chips 110. The chip connection parts 103 may include, for example, solder balls.

First terminals 141 may be formed on the top surface of each unit package region UPR around the lower semiconductor chip 110. The first terminals 141 may be formed using a screen printing technique, an ink-jet technique, or a soldering technique. The first terminals 141 may include solder balls. For example, the first terminals 141 may include at least one of tin (Sn), lead (Pb), nickel (Ni), gold (Au), silver (Ag), copper (Cu), and bismuth (Bi).

A lower mold layer 130 may be formed on the top surfaces of the unit package regions UPR and the scribing region SR of the lower substrate 101. The lower mold layer 130 may fill spaces between the lower substrate 101 and the lower semiconductor chips 110 and may cover the first terminals 141 and the lower semiconductor chips 110. The lower mold layer 130 may be formed by a molded underfill (MUF) method. A grinding process may be additionally performed on a top surface of the lower mold layer 130 to planarize the top surface of the lower mold layer 130. In this case, top surfaces of the lower semiconductor chips 110 may be exposed. The lower mold layer 130 may include an epoxy mold compound (EMC), an epoxy-based resin, or polyimide.

A first laser drilling process may be performed on the lower mold layer 130 to expose the first terminals 141 buried in the lower mold layer 130. Thus, through-holes 131 may be formed in the lower mold layer 130. The first terminals 141 may be provided in the through-holes 131.

After the through-holes 131 have been formed, a second laser drilling process may be performed on the lower mold layer 130 to form first and second extension trenches T1 and T2 in the lower mold layer 130. Each of the first extension trenches T1 may be formed between respective one of the lower semiconductor chips 110 and the first terminals 141 closest to the lower semiconductor chip 110. The first extension trench T1 may surround the lower semiconductor chip 110 as viewed in a plan view. The first extension trench T1 may open to the through-holes 131 exposing the first terminals 141 closest to the lower semiconductor chip 110. For example, upper portions of the through-holes 131 may in effect be expanded by the first extension trench T1. The total width of the upper portion of a through-hole 131 and the first extension trench T1 may be greater than the width of the lower portion of the through-hole 131. The first extension trench T1 may be shallower than the through-holes 131. In other words, a bottom of the first extension trench T1 may be disposed at a higher level than bottoms of the through-holes 131. In some examples, the first extension trenches T1 may be spaced apart from the lower semiconductor chips 110 by a predetermined distance to prevent the lower semiconductor chips 110 from being damaged by the laser used to form the first extension trenches T1. Thus, sidewalls of the lower semiconductor chips 110 may not be exposed by the first extension trenches T1.

Each of the second extension trenches T2 may be formed between the scribing region SR of the lower substrate 101 and the first terminals 141 closest to the scribing region SR. For example, each of the second extension trenches T2 may be formed in an edge region of the lower mold layer 130 on each of the unit package regions UPR. The second extension trench T2 may be open to the through-holes 131 exposing the first terminals 141 closest to the scribing region SR. As a result, upper portions of the through-holes 131 may in effect be expanded by the second extension trench T2. Widths of the upper portion of the through-hole 131 and the second extension trench T2 in total may be greater than the width of the lower portion of the through-hole 131. The second extension trench T2 may be shallower than the through-holes 131. In other words, the bottom of the second extension trench T2 may be disposed at a higher level than the bottoms of the through-holes 131.

Figure 8B:
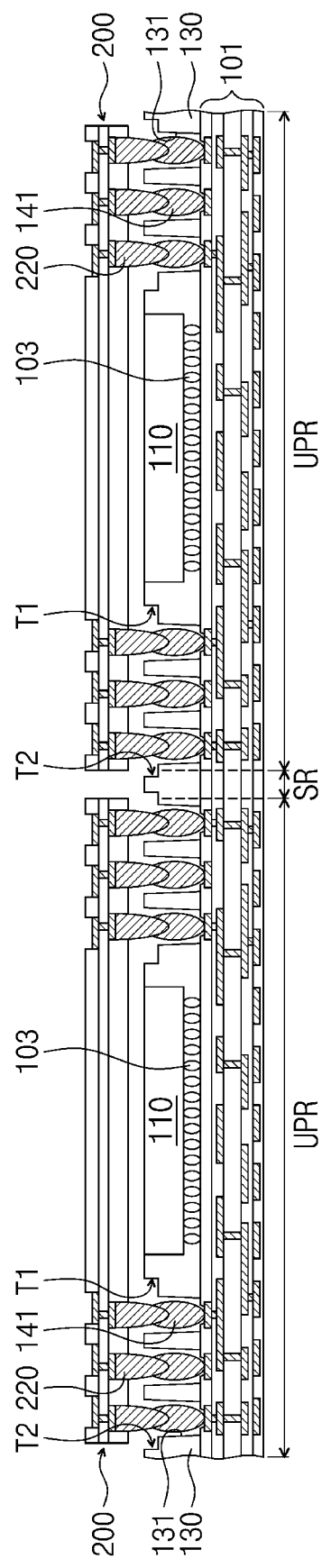

Referring to FIG. 8B, interposer substrates 200 may be stacked on the unit package regions UPR of the lower substrate 101. The interposer substrates 200 may be separated from each other and may be stacked on the unit package regions UPR, respectively. The interposer substrates 200 may include insulating layers, metal interconnection lines, and second terminals 220. For example, each of the interposer substrates 200 may have a structure in which the insulating layers and the metal interconnection lines are alternately stacked, and the second terminals 220 are disposed at the bottom of the interposer substrate 200 (i.e., on a bottom surface of an insulating layer) and electrically connected to the metal interconnection lines of the interposer substrate 200. The second terminals 220 may include at least one of tin (Sn), lead (Pb), nickel (Ni), gold (Au), silver (Ag), copper (Cu), and bismuth (Bi).

The stacking of the interposer substrates 200 on the unit package regions UPR of the lower substrate 101 may include providing a flux agent onto surfaces of the second terminals 220 and aligning the second terminals 220 of the interposer substrates 200 with the first terminals 141, respectively. The second terminals 220 may come into contact with the first terminals 141. The flux agent may remove oxide layers formed on the surfaces of the first and second terminals 141 and 220 serves to easily unify the first and second terminals 141 and 220 in a subsequent reflow process.

Figure 8C:
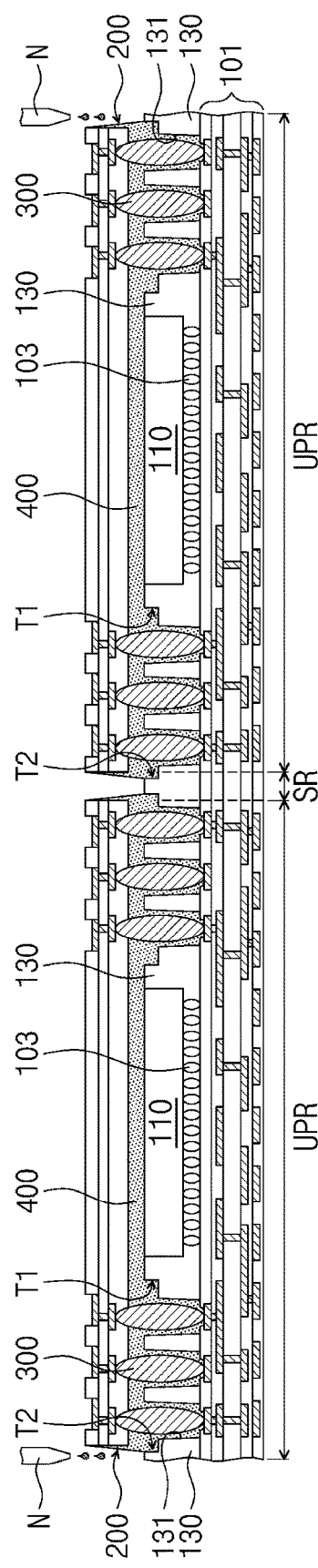

Referring to FIG. 8C, the reflow process may be performed on the first and second terminals 141 and 220 to form lower connection terminals 300. The first terminals 141 and the second terminals 220 may be melted in the reflow process, and thus each of the first terminals 141 and each of the second terminals 220, which are connected to each other, may be unified to form one connection terminal.

An underfill resin layer 400 may be formed in a space between the lower substrate 101 and each of the interposer substrates 200. The forming of the underfill resin layer 400 may include locating a nozzle N at a side of the interposer substrate 200, filling the space between the interposer substrate 200 and the lower substrate 101 with an underfill resin solution dispensed from the nozzle N, and hardening (curing) the underfill resin solution. The underfill resin layer 400 may be formed in a space between the lower semiconductor chip 110 and the interposer substrate 200, the first extension trenches T1, a space between the lower mold layer 130 and the interposer substrate 200, the through-holes 131, and the second extension trenches T2. The underfill resin layer 400 may be formed to surround sidewalls of the lower connection terminals 300. The underfill resin layer 400 may include an epoxy-based resin, benzocyclobutene, or polyimide. The underfill resin layer 400 may further include a silica filler. In certain examples, the underfill resin layer 400 includes an adhesive and a flux. The flux may include an oxide-removing agent. In certain examples, the underfill resin layer 400 may include a silica filler or a flux. In certain examples, the underfill resin layer 400 may include non-conductive paste.

In some examples, spaces between end portions of the interposer substrate 200 and end portions of the lower mold layer 130 may be expanded or extended since the second extension trenches T2 are formed, and thus the underfill resin solution may be easily injected into the space between the interposer substrate 200 and the lower mold layer 130. In addition, the widths of the upper portions of the through-holes 131 may in effect be increased by the first and second extension trenches T1 and T2, and thus the underfill resin solution may be easily injected into the through-holes 131. On the other hand, the second extension trenches T2 may function as dams to prevent the underfill resin solution from overflowing onto sidewalls and/or a top surface of the interposer substrate 200.

Figure 8D:
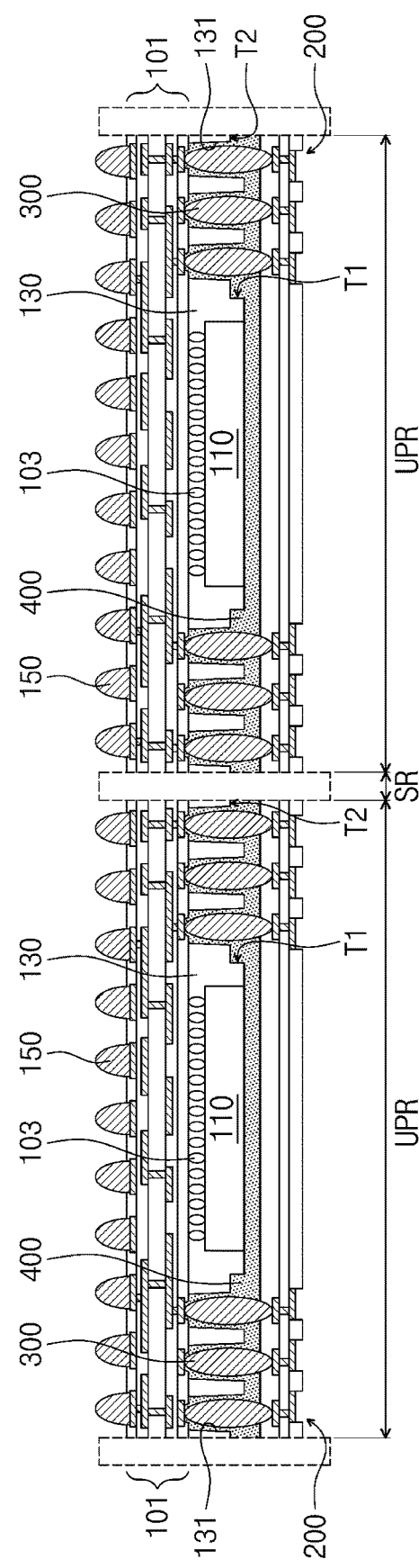

Referring to FIG. 8D, external terminals 150 may be formed on a bottom surface of the lower substrate 101. The external terminals 150 may be formed by a soldering process. The external terminals 150 may include, for example, solder balls.

A cutting process may be performed along the scribing region SR of the lower substrate 101 to cut the lower substrate 101 and the lower mold layer 130. Thus, packaged semiconductor devices including unit lower packages, on which the interposer substrates 200 are stacked, respectively, may be separated from each other. At this stage, each packaged semiconductor device may be considered its own semiconductor package.

Referring again to FIGS. 2A and 2B, an upper package 600 may be stacked on the interposer substrate 200. The upper package 600 may include an upper substrate 601, upper semiconductor chips 610 mounted on the upper substrate 601, bonding wires 620 electrically connecting the upper semiconductor chips 610 to the upper substrate 601, and an upper mold layer 630 covering the upper semiconductor chips 610. Upper connection terminals 500 may be formed between the upper package 600 and the interposer substrate 200. The upper connection terminals 500 may include, for example, solder balls. Thus, a semiconductor package in the form of a package-on-package (PoP), for example, is completed.

Figure 9A:
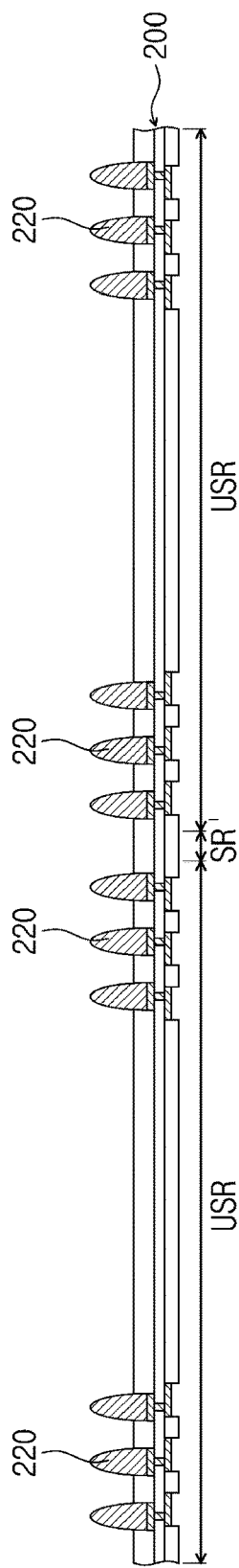
FIGS. 9A, 9B and 9C are cross-sectional views of semiconductor packages during the course of their manufacture and together illustrate a manufacturing method according to the inventive concepts.
Figure 9B:
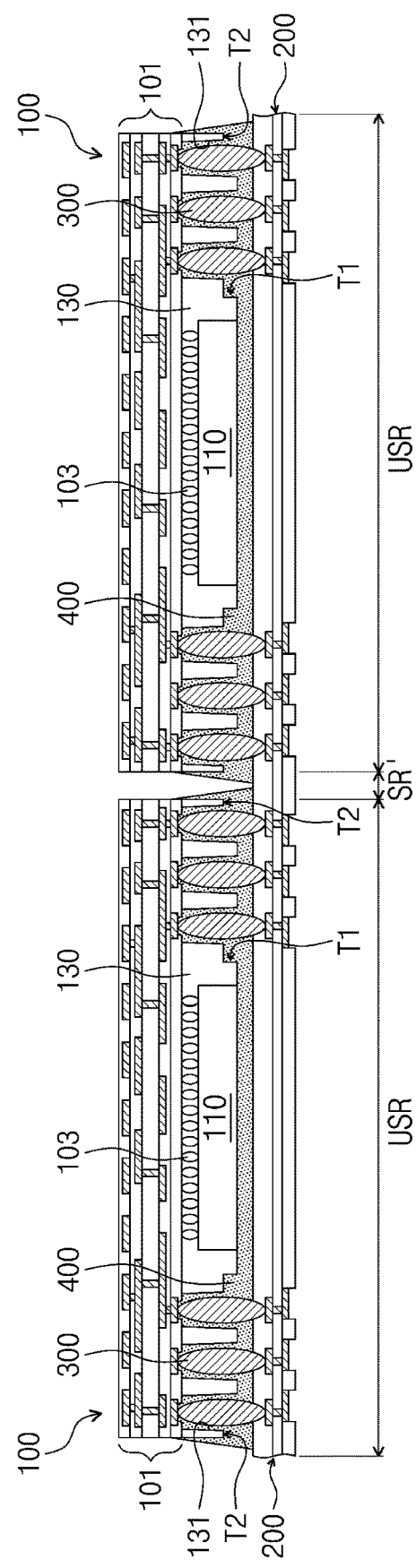
Figure 9C:
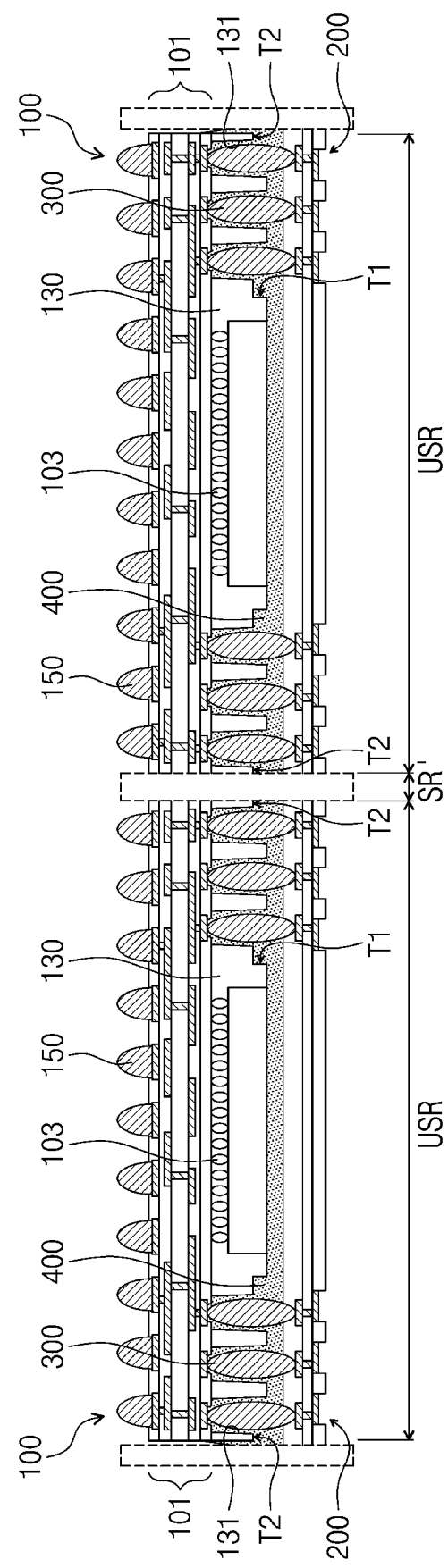

FIGS. 9A to 9C are cross-sectional views illustrating a method of manufacture according to some examples of the inventive concepts. Hereinafter, the same elements as described in the above examples will be indicated by the same reference numerals or the same reference designators, and the descriptions thereto will be omitted for the sake of brevity.

Referring to FIG. 9A, an interposer substrate 200 may be prepared. The interposer substrate 200 may include insulating layers, metal interconnection lines, and second terminals 220. The second terminals 220 may adhere to a bottom surface of the interposer substrate 200. The interposer substrate 200 may include unit substrate regions USR and a scribing region SR'. The scribing region SR' may be disposed between the unit substrate regions USR. For example, each of the unit substrate regions USR may be surrounded by the scribing region SR' when viewed in a plan view.

Referring to FIG. 9B, a lower package 100 may be stacked on each of the unit substrate regions USR of the interposer substrate 200. The lower packages 100 may be spaced apart from each other on the interposer substrate 200. The lower package 100 may include a lower substrate 101, a lower semiconductor chip 110 mounted on a top surface of the lower substrate 101, a lower mold layer 130 covering sidewalls of the lower semiconductor chip 110 and filling a space between the lower substrate 101 and the lower semiconductor chip 110, and first terminals 141 (see FIG. 8B). The lower mold layer 130 may include through-holes 131 exposing the first terminals 141, and first and second extension trenches T1 and T2. The stacking of the lower packages 100 on the interposer substrate 200 may include aligning the first terminals 141 of the lower packages 100 with the second terminals 220 of the interposer substrate 200, and performing a reflow process for unifying the first and second terminals 141 and 220, thereby forming lower connection terminals 300.

An underfill resin layer 400 may be formed in a space between the interposer substrate 200 and each of the lower packages 100. The underfill resin layer 400 may be formed in a space between the lower semiconductor chip 110 and the interposer substrate 200, the first extension trench T1, a space between the lower mold layer 130 and the interposer substrate 200, the through-holes 131, and the second extension trench T2. The underfill resin layer 400 may be formed to surround sidewalls of the lower connection terminals 300.

Referring to FIG. 9C, external terminals 150 may be formed on bottom surfaces of the lower substrates 101. Subsequently, a cutting process may be performed along the scribing region SR' of the interposer substrate 200 to separate the unit substrate regions USR of the interposer substrate 200 from each other. Thus, a unit interposer substrate 200 on which one lower package 100 is stacked may be formed.

Referring again to FIG. 2B, the upper package 600 may be stacked on the interposer substrate 200 with the upper connection terminals 500 interposed therebetween.

FIGS. 10A and 10B are cross-sectional views illustrating a method of manufacture according to some examples of the inventive concepts. Hereinafter, the same elements as described in the above examples will be indicated by the same reference numerals or the same reference designators, and the descriptions thereto will be omitted for the sake of brevity.

Referring to FIG. 10A, after forming the through-holes 131 and the first and second extension trenches T1 and T2 in the lower mold layer 130 in FIG. 8A, an adhesive layer 800 may be formed on the lower mold layer 130. The adhesive layer 800 may be formed on each of the unit package regions UPR of the lower substrate 101. The adhesive layer 800 may be in a liquid or solid state. For example, the adhesive layer 800 may include an adhesive and a flux. The flux may include an oxide-removing agent. In FIG. 10A, the adhesive layer 800 may be formed on the top surface of the lower mold layer 130 and the top surface of the lower semiconductor chip 110. However, examples of the inventive concepts are not limited thereto. In certain examples, the adhesive layer 800 may fill the through-holes 131 and the first and second extension trenches T1 and T2.

Referring to FIG. 10B, interposer substrates 200 may be stacked on the unit package regions UPR of the lower substrate 101, respectively. The stacking of the interposer substrates 200 on the unit package regions UPR of the lower substrate 101 may include aligning the second terminals 220 (see FIG. 8B) of the interposer substrates 200 with the first terminals 141 (see FIG. 8B), and performing a reflow process for unify the first and second terminals 141 and 220, thereby forming lower connection terminals 300. When the second terminals 220 of the interposer substrate 200 are aligned with the first terminals 141, the adhesive layer 800 may fill a space between the lower semiconductor chip 110 and the interposer substrate 200, a space between the lower mold layer 130 and the interposer substrate 200, the regions of the through-holes 131 not occupied by the connection terminals 300, and the first and second extension trenches T1 and T2. The adhesive layer 800 may cover sidewalls of the lower connection terminals 300. Thus the adhesive layer may also serve as a connection-terminal protecting layer. In examples in which the adhesive layer 800 includes the flux agent, the process of providing the flux agent onto the surfaces of the first terminals 141 may be omitted.

Subsequent processes after the reflow process may be substantially the same as described with reference to FIG. 8D, and thus the descriptions thereto are omitted.

Figure 11:
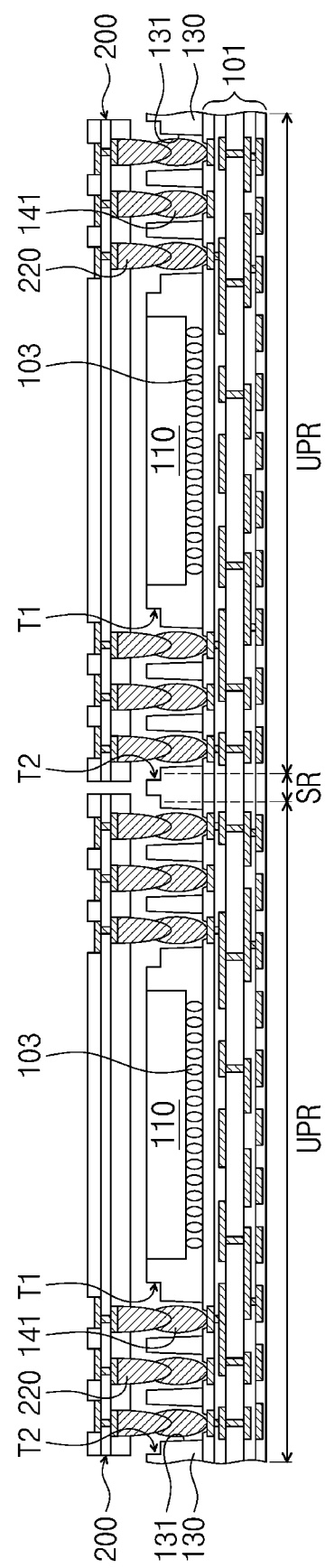
FIG. 11 is a cross-sectional view of semiconductor packages during the course of their manufacture and together illustrate a manufacturing method according to the inventive concepts.

FIG. 11 is a cross-sectional view illustrating a method of manufacture according to some examples of the inventive concepts. Hereinafter, the same elements as described in the above examples will be indicated by the same reference numerals or the same reference designators, and the descriptions thereto will be omitted for the sake of brevity.

Referring to FIG. 11, interposer substrates 200 may be stacked on the unit package regions UPR of the lower substrate 101, respectively. The second terminals 220 adhered to the bottom surface of each of the interposer substrates 200 may be aligned with the first terminals 141 disposed on each of the unit package regions UPR. In some examples, a width of the interposer substrate 200 may be greater than a width of the unit package region UPR of the lower substrate 101. For example, outer sidewalls of the interposer substrate 200 may be disposed on the top surface of the lower mold layer 130 disposed on the scribing region SR of the lower substrate 101. Thus, in the cutting process of separating the unit lower packages 100, the interposer substrate 200 and the lower substrate 101 may be cut in such a way that outer sidewalls of the unit package region UPR of the lower substrate 101 are aligned with outer sidewalls of the interposer substrate 200. In addition, the underfill resin solution (not shown) may overflow onto the top surface of the interposer substrate 200, and thus portions of the underfill resin layer may be formed on top surfaces of end portions of the interposer substrate 200. In this case, the end portions of the interposer substrate 200, which are disposed on the scribing region SR, may be removed by the cutting process. Thus, the portions of the underfill resin layer, which are formed on the end portions of the interposer substrate 200, may also be removed.

Subsequent processes after the process of stacking the interposer substrates 200 on the lower substrate 101 may be substantially the same as described with reference to FIGS. 8C and 8D, and thus the descriptions thereto are omitted.

Figure 12:
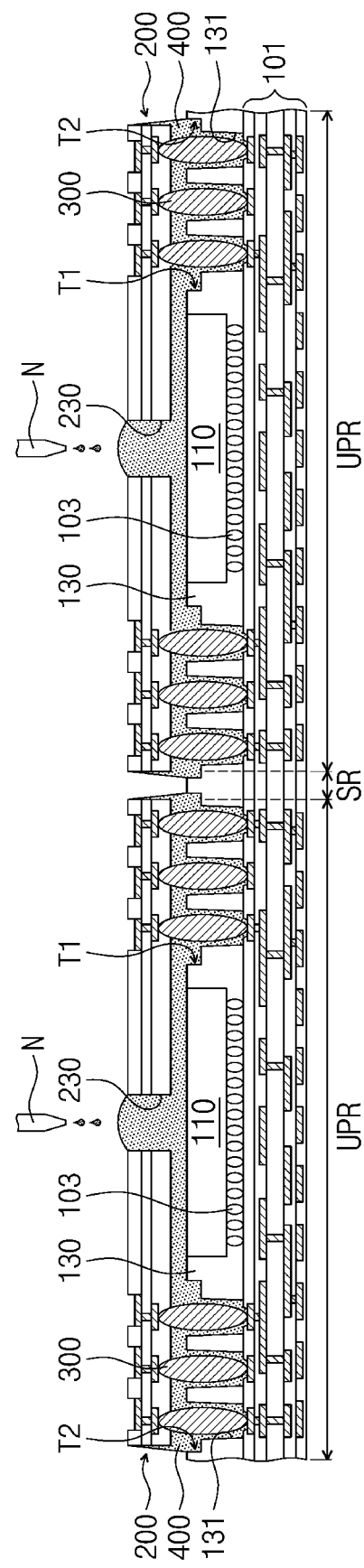
FIG. 12 is a cross-sectional view of semiconductor packages during the course of their manufacture and illustrates a manufacturing method according to the inventive concepts.

FIG. 12 is a cross-sectional view illustrating a method of manufacture according to some examples of the inventive concepts. Hereinafter, the same elements as described in the above examples will be indicated by the same reference numerals or the same reference designators, and the descriptions thereto will be omitted for the sake of brevity.

Referring to FIG. 12, after the reflow process for forming the lower connection terminals 300, the underfill resin layer 400 may be formed in the space between the interposer substrate 200 and the lower substrate 101. The interposer substrate 200 may include a through portion 230 formed in a central portion of the interposer substrate 200. The through portion 230 defines an opening through the interpose substrate 200. The forming of the underfill resin layer 400 may include locating a nozzle N on the through portion 230 of the interposer substrate 200, filling the space between the interposer substrate 200 and the lower substrate 101 with an underfill resin solution dispensed from the nozzle N through the opening of the through portion 230, and hardening (curing) the underfill resin solution. The underfill resin layer 400 may fill the opening defined by the through portion 230 of the interposer substrate 200. Since the underfill resin solution is injected into the through portion 230 of the interposer substrate 200, a narrow space between the lower semiconductor chip 110 and the central portion of the interposer substrate 200 may be easily filled with the underfill resin solution.

Although methods of manufacture according to the inventive concepts shown in and described above with reference to FIGS. 8A-8D, 9A-9C, 10A and 10B, 11 and 12 all include mounting an interposer substrate of the type shown in and described with reference to FIGS. 1-6 to a lower package, it will be readily apparent to those of ordinary skill in the art that the same methods may be applied to examples of the inventive concept shown in and described with reference to FIG. 7 in which an upper package 600 having a substrate 601 is mounted to a lower package. In general, upper packages 600 may be mounted to the lower packages in place of the interposer substrate(s).

According to some examples of the inventive concepts, the underfill resin layer disposed between the lower package and the interposer substrate may surround the sidewalls of the lower connection terminals and may fill the through-holes in which the lower connection terminals are provided. Since the underfill resin layer supports the lower connection terminals, it is possible to prevent cracks from occurring in the lower connection terminals by stress caused between the lower package and the interposer substrate.

While the inventive concepts have been described with reference to example examples, it will be apparent to those skilled in the art that various changes and modifications may be made without departing from the spirits and scopes of the inventive concepts. Therefore, it should be understood that the above examples are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor package comprising:
   a first substrate;
   a first semiconductor chip disposed on the first substrate;
   a plurality of support patterns laterally spaced apart from each other on an upper surface of the first semiconductor chip;
   a second substrate on the plurality of support patterns;
   a connection terminal between the first substrate and the second substrate, the connection terminal electrically connecting the first substrate to the second substrate; and
   a molding structure disposed between the first substrate and the second substrate and surrounding sidewalls of the connection terminal,
   wherein each of the plurality of support patterns extends through a portion of the molding structure between the first semiconductor chip and the second substrate so as to contact the upper surface of the first semiconductor chip.

2. The semiconductor package of claim 1, wherein the plurality of support patterns are in contact with a bottom surface of the second substrate.

3. The semiconductor package of claim 1,
   wherein the molding structure extends to a gap between side surfaces of the plurality of support patterns, the gap provided between the upper surface of the first semiconductor chip and a bottom surface of the second substrate.

4. The semiconductor package of claim 1, wherein the plurality of support patterns are connected to the second substrate.

5. The semiconductor package of claim 4, wherein the plurality of support patterns include the same material as the second substrate.

6. The semiconductor package of claim 1, further comprising:
   a third substrate disposed on the second substrate and electrically connected to the second substrate; and
   a second semiconductor chip mounted on the third substrate.

7. The semiconductor package of claim 1, the plurality of support patterns include an epoxy-based resin or a metal material.

8. The semiconductor package of claim 1, wherein a top surface of each of the plurality of support patterns is in contact with the second substrate, and
   wherein a bottom surface of each of the plurality of support patterns is in contact with the first semiconductor chip.

9. The semiconductor package of claim 1, wherein the molding structure comprises:
   a first molding layer covering a side surface of the first semiconductor chip and including an epoxy-based resin; and
   a second molding layer disposed on the first molding layer and including an epoxy-based resin.

10. A semiconductor package comprising:
a first semiconductor chip mounted on a first substrate;
a second substrate on the first substrate, the first semiconductor chip disposed between the first substrate and the second substrate;
a connection terminal between the first substrate and the second substrate, the connection terminal electrically connecting the first substrate to the second substrate;
a molding structure disposed between the first substrate and the second substrate and surrounding sidewalls of the connection terminal; and
wherein the second substrate includes protrusions protruding from a bottom surface of the second substrate,
wherein the protrusions extend through the molding structure to an upper surface of the first semiconductor chip, the protrusions being in contact with the upper surface of the first semiconductor chip.

11. The semiconductor package of claim 10, wherein the protrusions are laterally spaced apart from each other.

12. The semiconductor package of claim 10, wherein each of the protrusions include the same material as a lowermost one of stacked layers of the second substrate.

13. The semiconductor package of claim 12, the protrusions include an insulating material.

14. The semiconductor package of claim 13, wherein the protrusions include a photo solder resist (PSR).

15. The semiconductor package of claim 10, wherein the second substrate comprises an interposer substrate.

16. The semiconductor package of claim 15, further comprising:
a third substrate disposed on the second substrate and electrically connected to the second substrate; and
a second semiconductor chip mounted on the third substrate.

17. A semiconductor package comprising:
a first semiconductor chip mounted on a first substrate;
a second substrate on the first semiconductor chip;
a plurality of support patterns laterally spaced apart from each other between the first semiconductor chip and the second substrate;
a connection terminal between the first substrate and the second substrate, the connection terminal electrically connecting the first substrate to the second substrate; and
a molding structure disposed between the first substrate and the second substrate and between the first semiconductor chip and the second substrate, the molding structure surrounding sidewalls of the connection terminal,
wherein a top surface of each of the plurality of support patterns is in contact with the second substrate,
wherein a bottom surface of each of the plurality of support patterns is in contact with the first semiconductor chip, and
wherein the molding structure extends between the plurality of support patterns.

18. The semiconductor package of claim 17, wherein the second substrate comprises an interposer substrate.

* * * * *